(12) United States Patent
Suzuki et al.

(10) Patent No.: US 9,780,338 B2
(45) Date of Patent: *Oct. 3, 2017

(54) LIGHT-EMITTING ELEMENT, DISPLAY MODULE, LIGHTING MODULE, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Tsunenori Suzuki, Kanagawa (JP); Shogo Uesaka, Kanagawa (JP); Ryohei Yamaoka, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/364,746

(22) Filed: Nov. 30, 2016

(65) Prior Publication Data

US 2017/0084876 A1 Mar. 23, 2017

Related U.S. Application Data

(63) Continuation of application No. 14/452,841, filed on Aug. 6, 2014, now Pat. No. 9,515,278.

(30) Foreign Application Priority Data

Aug. 9, 2013 (JP) .................................. 2013-166867

(51) Int. Cl.
*H01L 27/15* (2006.01)
*H01L 29/08* (2006.01)
(Continued)

(52) U.S. Cl.
CPC ........ *H01L 51/5278* (2013.01); *H01L 27/322* (2013.01); *H01L 27/3209* (2013.01); *H01L 27/3211* (2013.01); *H01L 51/5012* (2013.01); *H01L 51/006* (2013.01); *H01L 51/0052* (2013.01); *H01L 51/0054* (2013.01); *H01L 51/0058* (2013.01); *H01L 51/0072* (2013.01);
(Continued)

(58) Field of Classification Search
None
See application file for complete search history.

(56) References Cited

U.S. PATENT DOCUMENTS 5,393,614 A 2/1995 Nakada
6,013,384 A 1/2000 Kido et al.
(Continued)

FOREIGN PATENT DOCUMENTS

EP 2 333 859 A1 6/2011
EP 2 355 199 A1 8/2011
(Continued)

*Primary Examiner* — Calvin Choi
(74) *Attorney, Agent, or Firm* — Husch Blackwell LLP

(57) ABSTRACT

A tandem light-emitting element in which generation of crosstalk can be suppressed even when the element is applied to a high-definition display is provided. In the tandem light-emitting element, a layer in contact the anode side of an intermediate layer contains 2,9-bis(naphthalen-2-yl)-4,7-diphenyl-1,10-phenanthroline (abbreviation: NBPhen).

24 Claims, 12 Drawing Sheets

(51) Int. Cl.
  *H01L 29/26* (2006.01)
  *H01L 31/12* (2006.01)
  *H01L 33/00* (2010.01)
  *H01L 35/24* (2006.01)
  *H01L 51/00* (2006.01)
  *H01L 51/52* (2006.01)
  *H01L 51/50* (2006.01)
  *H01L 27/32* (2006.01)

(52) U.S. Cl.
  CPC ...... *H01L 51/0074* (2013.01); *H01L 51/0077* (2013.01); *H01L 51/0085* (2013.01); *H01L 51/0091* (2013.01); *H01L 2251/53* (2013.01)

(56) References Cited

U.S. PATENT DOCUMENTS

| | | | |
|---|---|---|---|
| 6,387,546 B1 | 5/2002 | Hamada et al. | |
| 6,524,728 B1 | 2/2003 | Kijima et al. | |
| 6,821,649 B2 | 11/2004 | Kambe et al. | |
| 6,972,334 B1 | 12/2005 | Shibanuma et al. | |
| 7,018,724 B2 | 3/2006 | Kambe et al. | |
| 7,732,808 B2 | 6/2010 | Ikeda et al. | |
| 7,956,349 B2 | 6/2011 | Tsutsui et al. | |
| 8,080,934 B2 | 12/2011 | Kido et al. | |
| 8,115,382 B2 | 2/2012 | Seo et al. | |
| 8,482,193 B2 | 7/2013 | Kido et al. | |
| 9,515,278 B2 * | 12/2016 | Suzuki | H01L 51/5278 |
| 2002/0139986 A1 | 10/2002 | Okada et al. | |
| 2003/0189401 A1 | 10/2003 | Kido et al. | |
| 2004/0027061 A1 | 2/2004 | Seo et al. | |
| 2004/0100189 A1 | 5/2004 | Adachi et al. | |
| 2005/0151466 A1 | 7/2005 | Liao et al. | |
| 2005/0221124 A1 | 10/2005 | Hwang et al. | |
| 2006/0043859 A1 | 3/2006 | Fukuoka et al. | |
| 2006/0138453 A1 | 6/2006 | Thompson et al. | |
| 2006/0154554 A1 | 7/2006 | Nomura et al. | |
| 2006/0158102 A1 | 7/2006 | Kawamura et al. | |
| 2007/0037983 A1 | 2/2007 | Nomura et al. | |
| 2010/0102450 A1 | 4/2010 | Narayan | |
| 2010/0133523 A1 | 6/2010 | Nowatari et al. | |
| 2010/0181898 A1 | 7/2010 | Nakamura et al. | |
| 2011/0198578 A1 | 8/2011 | Heuser et al. | |
| 2011/0210316 A1 | 9/2011 | Kadoma et al. | |
| 2012/0007063 A1 | 1/2012 | Langer et al. | |
| 2012/0091923 A1 | 4/2012 | Kastner-Jung et al. | |
| 2012/0211082 A1 | 8/2012 | Akiyama et al. | |
| 2012/0223346 A1 | 9/2012 | Ohsawa et al. | |
| 2013/0020561 A1 | 1/2013 | Suzuki et al. | |
| 2013/0048967 A1 | 2/2013 | Nishido et al. | |
| 2013/0256639 A1 | 10/2013 | Kambe et al. | |
| 2014/0339524 A1 | 11/2014 | Shitagaki et al. | |
| 2015/0041795 A1 | 2/2015 | Suzuki et al. | |

FOREIGN PATENT DOCUMENTS

| | | |
|---|---|---|
| JP | 07-082551 A | 3/1995 |
| JP | 09-063771 A | 3/1997 |
| JP | 10-340781 A | 12/1998 |
| JP | 11-307264 A | 11/1999 |
| JP | 2001-267080 A | 9/2001 |
| JP | 2003-272860 A | 9/2003 |
| JP | 2004-175691 A | 6/2004 |
| JP | 2004-303489 A | 10/2004 |
| JP | 2005-108720 A | 4/2005 |

* cited by examiner

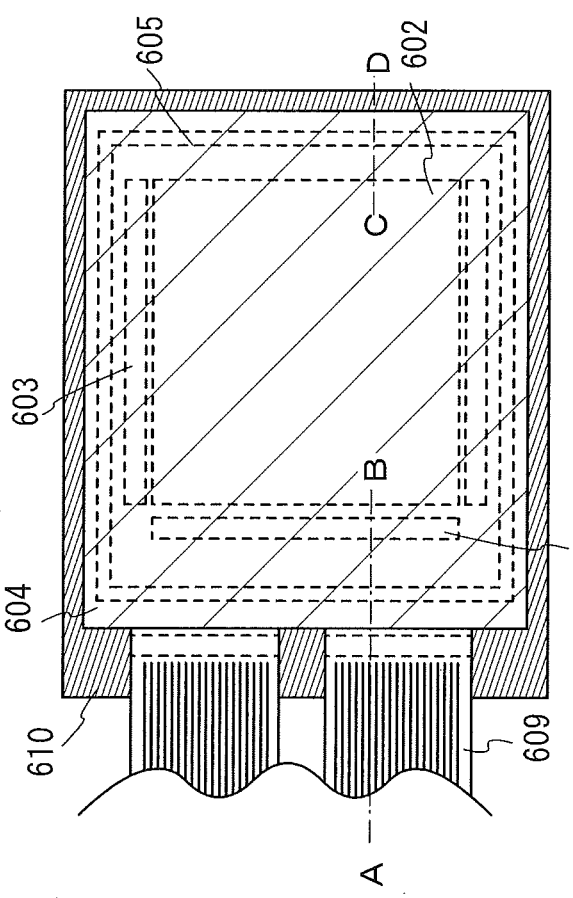
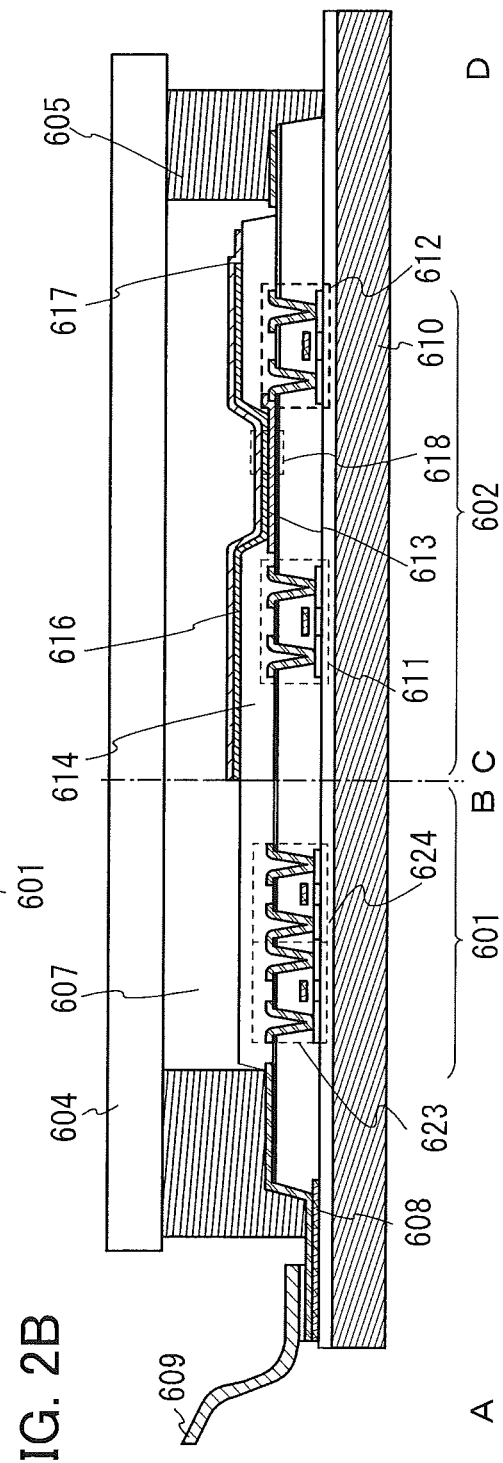
FIG. 2A
FIG. 2B

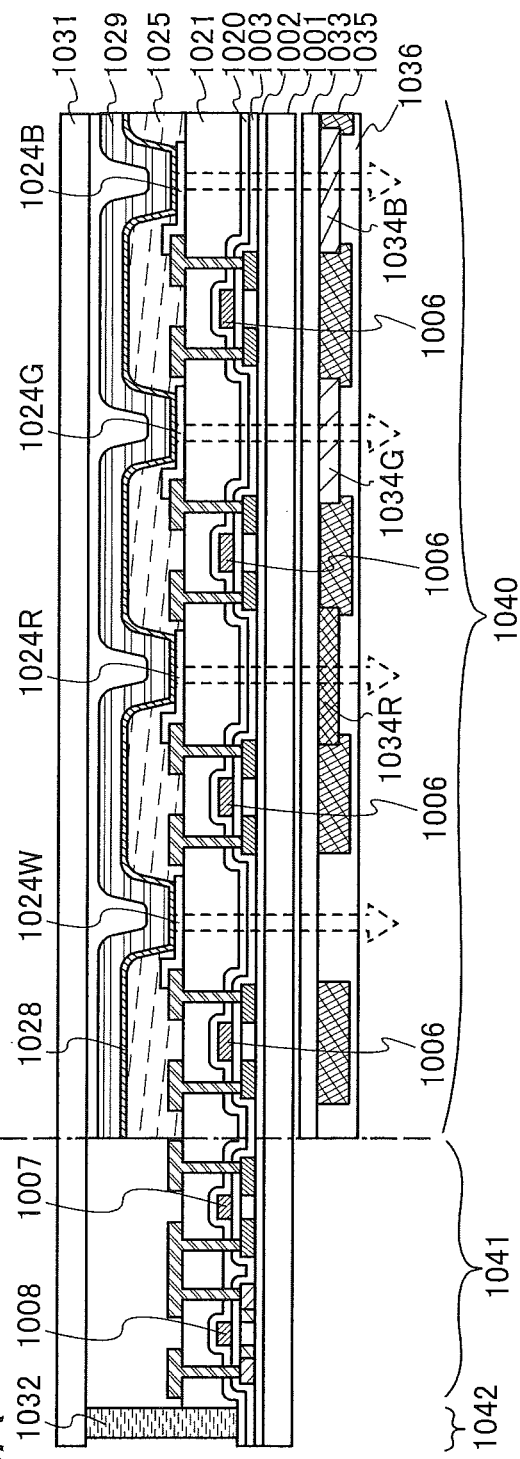
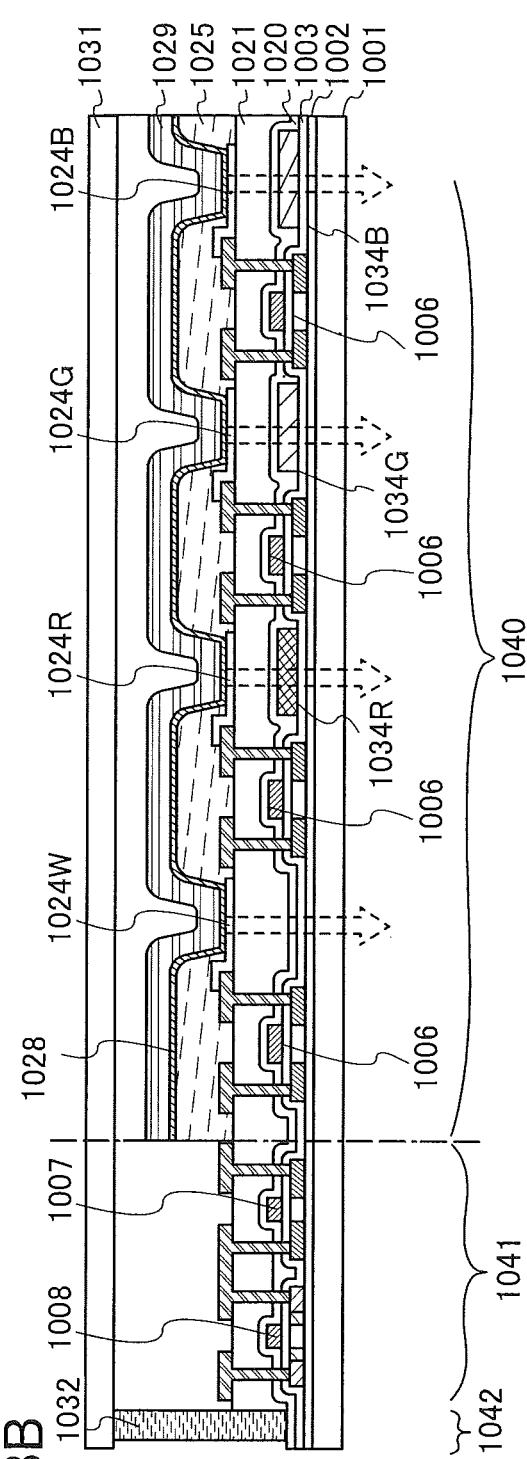

FIG. 5A
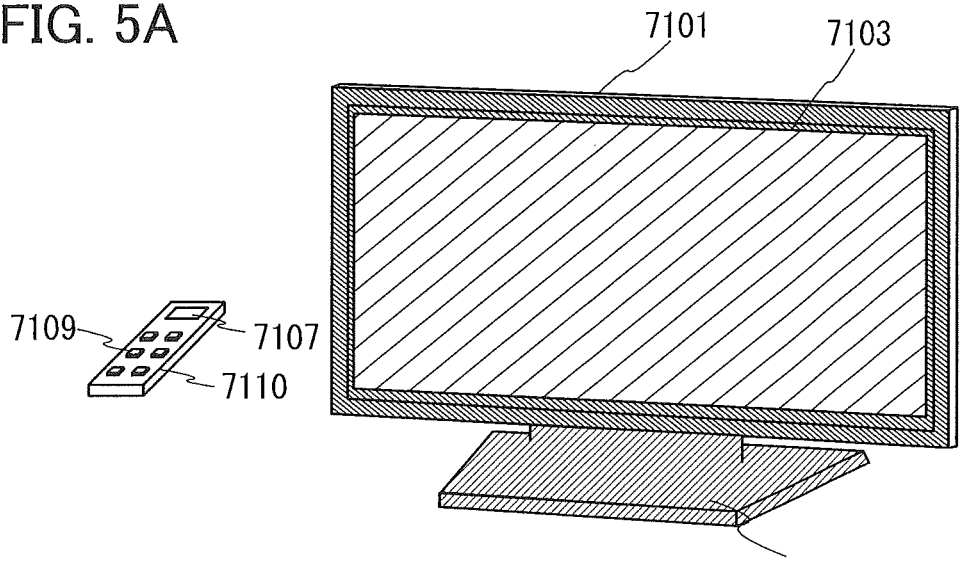
FIG. 5B1
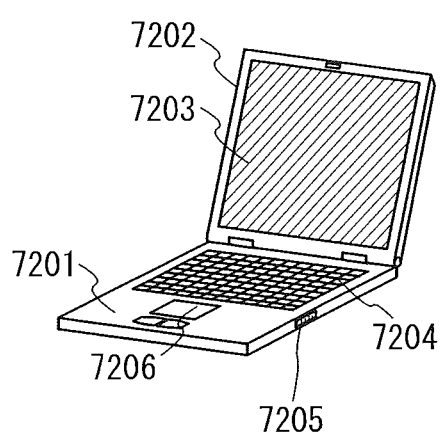
FIG. 5B2
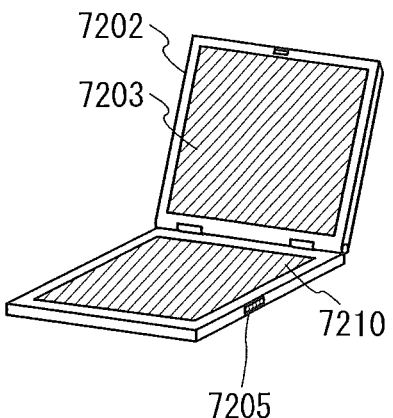
FIG. 5C
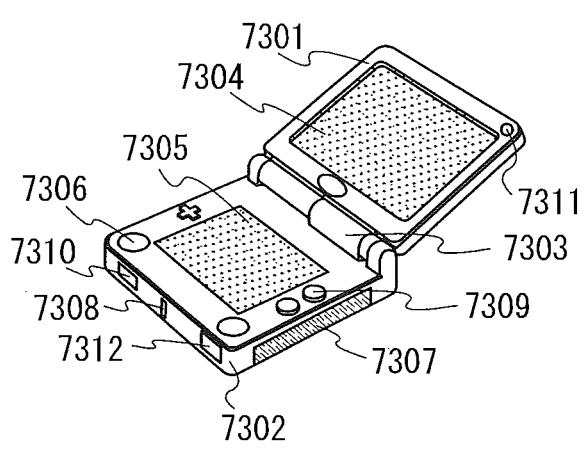
FIG. 5D
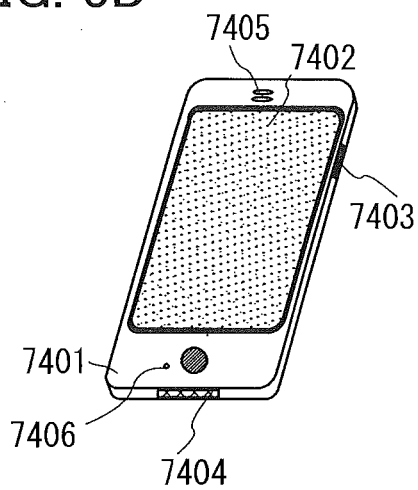

LIGHT-EMITTING ELEMENT, DISPLAY MODULE, LIGHTING MODULE, LIGHT-EMITTING DEVICE, DISPLAY DEVICE, ELECTRONIC DEVICE, AND LIGHTING DEVICE

This application is a continuation of copending U.S. application Ser. No. 14/452,841, filed on Aug. 6, 2014 which is incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a driving method thereof, or a manufacturing method thereof. In particular, one embodiment of the present invention relates to a light-emitting element which includes a light-emitting layer containing an organic compound between a pair of electrodes. Furthermore, the present invention relates to a light-emitting device including the light-emitting element and an electronic device including the light-emitting device.

2. Description of the Related Art

In recent years, mobile devices show remarkable development, and one can easily enjoy image works anytime and anywhere with a small image reproducing device, a display of a smartphone or a tablet terminal, and the like. In addition, image data is being more often downloaded or transferred by using a small memory, and thus, the demand for the mobile devices is being increased.

In order to enjoy high-quality images with a small display such as a display of a mobile device, the display is required to have sufficiently high definition.

A light-emitting element (also referred to as an electroluminescence element or an EL element) which includes a light-emitting layer containing an organic compound between a pair of electrodes is capable of high-speed response and DC drive at low voltage, and can be manufactured to be thin and lightweight. Therefore, the light-emitting element is being put into practical use as a flat panel display element or a mobile display element.

An EL element includes a pair of electrodes and an EL layer containing a light-emitting substance, which is provided between the electrodes, and emits light when the light-emitting substance contained in the EL layer is excited by current flowing through the EL layer. Therefore, in order to obtain high emission intensity in such an EL element, current corresponding to the intensity needs to flow through the light-emitting layer, and power consumption is increased accordingly. In addition, as large current flows, degradation of the EL element is accelerated.

In view of the above, a light-emitting element which includes a stack of a plurality of EL layers and thereby capable of emitting light with higher luminance than a light-emitting element including only one EL layer, when current having the same current density flows through each light-emitting element, is proposed (e.g., see Patent Document 1). In a light-emitting element disclosed in Patent Document 1, a plurality of light-emitting units is separated from each other by a charge generation layer.

REFERENCE

Patent Document

[Patent Document 1] Japanese Published Patent Application No. 2003-272860

SUMMARY OF THE INVENTION

In the case of manufacturing a high-definition display by using a light-emitting element (hereinafter referred to as a tandem light-emitting element) as disclosed in Patent Document 1 in which a plurality of light-emitting units is separated from each other by a charge generation layer, problems which do not arise in lighting application or a display having a large pixel size are caused in some cases. One of such problems is an interference phenomenon between adjacent pixels, that is, crosstalk.

In the case of manufacturing a display by using a tandem light-emitting element, since white light emission can be easily obtained, such a full-color display is fabricated in many cases in which the same EL layer structure is employed for all pixels and a resonant structure and/or a color filter is combined so that each pixel can emit light of its expected color. That is, the EL layer is continuous between adjacent pixels.

In addition, a light-emitting element includes the EL layer between a pair of electrodes. In an active matrix light-emitting element, one of the pair of electrodes is divided for each pixel but the other electrode is continuous between a plurality of pixels. Accordingly, the pixel is driven by controlling the electrode divided for each pixel.

When part of the EL layer that is continuous between a plurality of light-emitting elements has high conductivity, in some cases, current also flows between a first electrode of an element which is to be driven, and an electrode (second electrode) that is continuous and provided in the adjacent pixel, leading to crosstalk. Part of the EL layer which has high conductivity is formed owing to a charge generation layer, which has therefore attracted attention.

In the charge generation layer, in order to improve an electron-injection property to a light-emitting unit on the anode side, an alkali metal such as lithium or cesium is used. In addition, an electron-transport material such as bathocuproine (abbreviation: BCP) or bathophenanthroline (abbreviation: BPhen) is widely used because, with these materials, a light-emitting element with low drive voltage and favorable characteristics can be manufactured. However, when the alkali metal is dispersed, the conductivity is increased, which leads to crosstalk in a high-definition display. Furthermore, it was found that even when the alkali metal and the electron-transport material are not mixed and only in contact with each other, crosstalk is similarly caused.

Without the alkali metal, the electron-injection property to the light-emitting unit deteriorates, and the drive voltage is increased. In this manner, it is very difficult to suppress crosstalk of the tandem light-emitting element while keeping sufficient characteristics for practical use.

Furthermore, it is known that a light-emitting element containing the above-described phenanthroline-based electron-transport material with favorable drive characteristics, such as bathocuproine (abbreviation: BCP) or bathophenanthroline (abbreviation: BPhen), has low heat resistance. Low heat resistance is a big problem for the element depending on the element structure.

In view of the above, it is an object of one embodiment of the present invention to provide a tandem light-emitting element in which generation of crosstalk can be suppressed even when the element is applied to a high-definition display.

It is another object of one embodiment of the present invention to provide a tandem light-emitting element which can display high-quality images.

It is another object of one embodiment of the present invention to provide a light-emitting element which can display high-quality images and consumes low power.

It is another object of one embodiment of the present invention to provide a tandem light-emitting element with high heat resistance. It is another object of one embodiment of the present invention to provide a novel light-emitting element.

It is another object of one embodiment of the present invention to provide, by using the above light-emitting element, a display module, a lighting module, a light-emitting device, a display device, an electronic device, and a lighting device which can display high-quality images.

It is another object of one embodiment of the present invention to provide, by using the above light-emitting element, a display module, a lighting module, a light-emitting device, a display device, an electronic device, and a lighting device which can display high-quality images and consume low power.

It is another object of one embodiment of the present invention to provide, by using the above light-emitting element, a display module, a lighting module, a light-emitting device, a display device, an electronic device, and a lighting device which have high heat resistance.

It is only necessary that at least one of the above-described objects be achieved in the present invention.

The above-described objects can be achieved with a tandem light-emitting element containing 2,9-bis(naphthalen-2-yl)-4,7-diphenyl-1,10-phenanthroline (abbreviation: NBPhen) in a layer in contact with the anode side of an intermediate layer.

One embodiment of the present invention is a light-emitting element including a first electrode, a second electrode, and an EL layer between the first electrode and the second electrode. The EL layer includes at least a plurality of light-emitting units and a plurality of charge generation layers each provided between the light-emitting units. A layer in contact with the anode side of the charge generation layer contains NBPhen.

Another embodiment of the present invention is a light-emitting element including a first electrode, a second electrode, and an EL layer between the first electrode and the second electrode. The EL layer includes a first light-emitting unit provided on the anode side and a second light-emitting unit provided on the cathode side. A charge generation layer is provided between the first light-emitting unit and the second light-emitting unit. A layer in contact with the charge generation layer of the first light-emitting unit contains NBPhen.

Another embodiment of the present invention is a light-emitting element with the above structure, in which the charge generation layer includes at least a charge generation region and an electron-injection buffer region. The electron-injection buffer region is provided on the anode side of the charge generation layer.

Another embodiment of the present invention is a light-emitting element with the above structure, in which an electron-relay region is provided on the charge generation region side of the electron-injection buffer region.

Another embodiment of the present invention is a light-emitting element with the above structure, in which the electron-injection buffer region contains an alkali metal.

Another embodiment of the present invention is a light-emitting element with the above structure, in which the alkali metal is lithium.

Another embodiment of the present invention is a light-emitting element with the above structure, in which the EL layer includes at least a layer containing a condensed aromatic compound or a condensed heteroaromatic compound and a layer which is in contact with the layer containing a condensed aromatic compound or a condensed heteroaromatic compound and contains NBPhen.

Another embodiment of the present invention is a light-emitting element with the above structure, in which the EL layer includes at least a layer containing a condensed aromatic compound or a condensed heteroaromatic compound having three or more condensed rings and a layer which is in contact with the layer containing a condensed aromatic compound or a condensed heteroaromatic compound and contains NBPhen.

Another embodiment of the present invention is a light-emitting element with the above structure, in which the layer containing a condensed aromatic compound or a condensed heteroaromatic compound is a layer containing a condensed heteroaromatic compound.

Another embodiment of the present invention is a light-emitting element with the above structure, in which a condensed heteroaromatic compound in the layer containing a condensed heteroaromatic compound includes two nitrogen atoms in one condensed ring.

Another embodiment of the present invention is a light-emitting element with the above structure, which emits phosphorescence.

Another embodiment of the present invention is a light-emitting element with the above structure, in which the layer containing a condensed heteroaromatic compound further contains iridium.

Another embodiment of the present invention is a light-emitting element with the above structure, in which the iridium is contained in part of the layer containing a condensed heteroaromatic compound and is not contained in a region in contact with the layer containing NBPhen.

One embodiment of the present invention is a display module including any of the above light-emitting elements.

One embodiment of the present invention is a lighting module including any of the above light-emitting elements.

One embodiment of the present invention is a light-emitting device including any of the above light-emitting elements and a unit for controlling the light-emitting element.

One embodiment of the present invention is a display device including any of the above light-emitting elements in a display portion and a unit for controlling the light-emitting element.

One embodiment of the present invention is a lighting device including any of the above light-emitting elements in a lighting portion and a unit for controlling the light-emitting element.

One embodiment of the present invention is an electronic device including any of the above light-emitting elements.

Note that the light-emitting device in this specification includes an image display device including a light-emitting element. Further, the category of the light-emitting device in this specification includes a module in which a light-emitting element is provided with a connector such as an anisotropic conductive film or a tape carrier package (TCP);

a module in which the end of the TCP is provided with a printed wiring board; and a module in which an IC (integrated circuit) is directly mounted on a light-emitting element by a COG (chip on glass) method. The light-emitting device also includes the one used in lighting equipment and the like.

According to one embodiment of the present invention, a tandem light-emitting element can be provided, in which generation of crosstalk can be suppressed even when the element is applied to a high-definition display.

According to one embodiment of the present invention, a tandem light-emitting element can be provided, which can display high-quality images.

According to one embodiment of the present invention, a light-emitting element can be provided, which can display high-quality images and consumes low power.

According to one embodiment of the present invention, a tandem light-emitting element with high heat resistance can be provided.

According to one embodiment of the present invention, by using the above light-emitting element, a display module, a lighting module, a light-emitting device, a display device, an electronic device, and a lighting device each of which can display high-quality images can be provided.

According to one embodiment of the present invention, by using the above light-emitting element, a display module, a lighting module, a light-emitting device, a display device, an electronic device, and a lighting device each of which can display high-quality images and consumes low power can be provided.

According to one embodiment of the present invention, by using the above light-emitting element, a display module, a lighting module, a light-emitting device, a display device, an electronic device, and a lighting device which have high heat resistance can be provided.

BRIEF DESCRIPTION OF THE DRAWINGS

FIGS. 2A and 2B are conceptual diagrams of an active matrix light-emitting device.

FIGS. 3A and 3B are conceptual diagrams of active matrix light-emitting devices.

FIGS. 5A to 5D each illustrate an electronic device.

DETAILED DESCRIPTION OF THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Accordingly, the present invention should not be interpreted as being limited to the content of the embodiments below.

Embodiment 1

Figure 1:
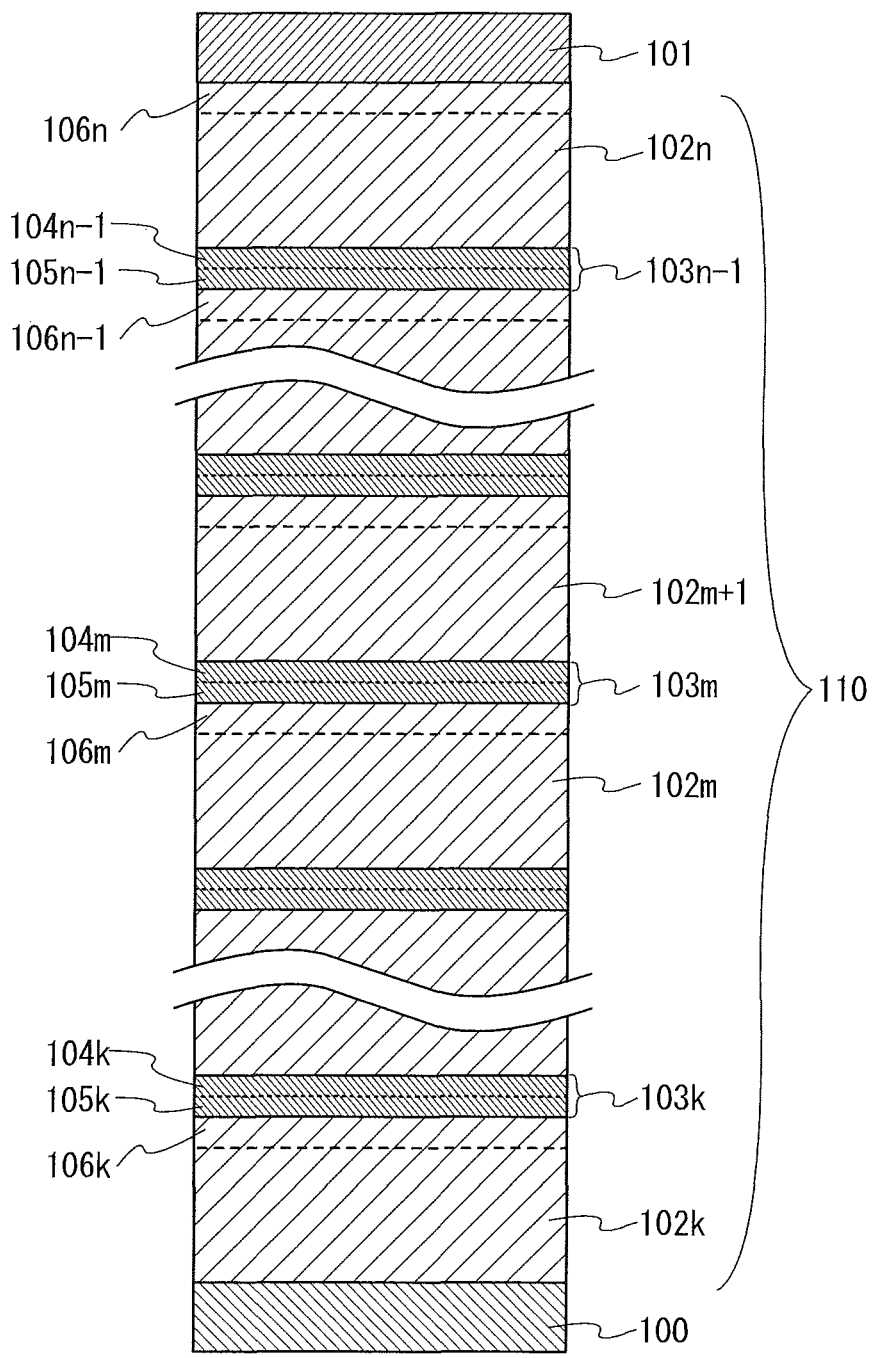
FIG. 1 is a conceptual diagram of a light-emitting element.

FIG. 1 is a conceptual diagram of a light-emitting element according to one embodiment of the present invention. The light-emitting element illustrated in FIG. 1 includes a plurality of (n) light-emitting units between a pair of electrodes (an anode 100 and a cathode 101). The light-emitting unit which is the closest to the anode 100 is a first light-emitting unit 102$k$, and the light-emitting unit which is the closest to the cathode 101 is an n-th light-emitting unit 102$n$.

The light-emitting element illustrated in FIG. 1 includes the light-emitting units (the first light-emitting unit 102$k$ . . . an m-th light-emitting unit 102$m$ . . . the n-th light-emitting unit 102$n$); charge generation layers (a first charge generation layer 103$k$ . . . an m-th charge generation layer 103$m$ . . . an (n−1)-th charge generation layer 103$n$−1); charge generation regions (a first charge generation region 104$k$ . . . an m-th charge generation region 104$m$ . . . an (n−1)-th charge generation region 104$n$−1); electron-injection buffer regions (a first electron-injection buffer region 105$k$ . . . an m-th electron-injection buffer region 105$m$ . . . an (n−1)-th electron-injection buffer region 105$n$−1); layers containing NBPhen (a first layer 106$k$ containing NBPhen . . . an m-th layer 106$m$ containing NBPhen . . . an (n−1)-th layer 106$n$−1 containing NBPhen . . . an n-th layer 106$n$ containing NBPhen); and the like.

In some cases, a plurality of light-emitting units, a plurality of charge generation layers, a plurality of charge generation regions, a plurality of electron-injection buffer regions, and a plurality of layers containing NBPhen are collectively referred to as a light-emitting unit 102, a charge generation layer 103, a charge generation region 104, an electron-injection buffer region 105, and a layer 106 containing NBPhen, respectively. In addition, the light-emitting units 102 between the anode 100 and the cathode 101 and the charge generation layers 103 each provided between the light-emitting units are collectively referred to as an EL layer 110.

The m-th charge generation layer 103$m$ (m is a natural number, 1≤m≤n−1) is provided between and in contact with the m-th light-emitting unit 102$m$ and an (m+1)-th light-emitting unit 102$m$+1. The m-th charge generation layer 103$m$ includes the m-th charge generation region 104$m$ in contact with the (m+1)-th light-emitting unit 102$m$+1 and the m-th electron-injection buffer region 105$m$ in contact with the m-th charge generation region 104$m$ and the m-th light-emitting unit 102$m$. Here, the charge generation layer 103 is in a floating state in which a power source or the like is not connected to the charge generation layer 103. In addition, the charge generation region 104 contains a substance having a hole-transport property and an acceptor substance with respect to the substance having a hole-transport property. The electron-injection buffer region 105 is a layer which has functions of accepting electrons generated in the charge generation region 104 and donating the electrons to the layer 106 containing NBPhen of the light-emitting unit 102.

The electron-injection buffer region 105 includes at least a very thin layer formed of an alkali metal, particularly, lithium, having a thickness of 0.1 nm to 5 nm at the interface on the anode side. Since the very thin layer is provided, an injection barrier of electrons is relieved, whereby electrons generated in the charge generation region 104 can be smoothly injected to the light-emitting unit 102. In addition, in the electron-injection buffer region 105, an electron-relay region may be provided between the lithium layer and the charge generation region 104 to prevent the interaction between the lithium layer and the charge generation region 104. The electron-relay region also functions as a layer for efficiently injecting electrons generated in the charge generation region 104 to the light-emitting unit 102. Thus, the electron-relay region may be formed so that the LUMO level of the electron-relay region can be a level between the acceptor level of the acceptor substance in the charge generation region 104 and the LUMO level of the layer in contact with the anode side of the charge generation layer 103 in which the electron-relay region is included (that is, the layer 106 containing NBPhen). Specifically, the LUMO level of the electron-relay region is preferably approximately higher than or equal to −5.0 eV and lower than or equal to −3.0 eV. The electron-relay region may be formed to a thickness of 1 nm to 40 nm, preferably, 1 nm to 10 nm.

Furthermore, the light-emitting unit 102 includes a plurality of layers each containing an organic compound and having a specific function. As the plurality of layers, the light-emitting unit 102 includes at least a light-emitting region containing a light-emitting substance and the layer 106 containing NBPhen, and the m-th light-emitting unit 102$m$ includes the m-th layer 106$m$ containing NBPhen. In this embodiment, the layer 106 containing NBPhen is provided to be the closest to the cathode 101 in each of the light-emitting units 102. The m-th layer 106$m$ containing NBPhen included in the m-th light-emitting unit 102$m$ is formed so as to be in contact with the m-th electron-injection buffer region 105$m$ included in the m-th charge generation layer 103$m$.

Although an example in which a large number of light-emitting units are provided is illustrated in FIG. 1, a light-emitting element which includes a smaller number of light-emitting units than the illustrated example, such as the case where n=2 or 3, is also of course one embodiment of the present invention. For example, in the case where two light-emitting units 102 are provided, n=2, and the m-th light-emitting unit 102$m$ corresponds to the first light-emitting unit 102$k$, and the (m+1)-th light-emitting unit 102$m$+1 corresponds to the n-th light-emitting unit 102$n$.

The charge generation region 104 contains, as described above, the substance having a hole-transport property and the acceptor substance. When voltage is applied between the electrodes (the anode 100 and the cathode 101), in the charge generation region 104, the acceptor substance extracts electrons from the substance having a hole-transport property to generate electrons and holes. The holes generated in the m-th charge generation region 104$m$ are injected to the (m+1)-th light-emitting unit 102$m$+1. The electrons generated in the m-th charge generation region 104$m$ at the same time are injected to the layer containing NBPhen (the m-th layer 106$m$ containing NBPhen) of the m-th light-emitting unit 102$m$ through the m-th electron-injection buffer region 105$m$. The charge generation region 104 is preferably formed to a thickness of greater than or equal to 10 nm and less than or equal to 200 nm.

As the acceptor substance contained in the charge generation region 104, 7,7,8,8-tetracyano-2,3,5,6-tetrafluoro-quinodimethane (abbreviation: $F_4$-TCNQ), chloranil, and the like can be given. In addition, transition metal oxides can be given. Moreover, oxides of metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron-accepting properties. In particular, molybdenum oxide is preferable because of its stability in the atmosphere, low hygroscopic property, and easiness of handling.

As the substance having a hole-transport property, any of a variety of organic compounds such as aromatic amine compounds, carbazole derivatives, aromatic hydrocarbons, and high molecular compounds (e.g., oligomers, dendrimers, or polymers) can be used. Note that a substance having a hole mobility of higher than or equal to $10^{-6}$ cm$^2$/Vs is preferable.

As the aromatic amine compounds, for example, there are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

As specific examples of the carbazole derivatives, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Moreover, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; and the like can also be used.

Examples of the aromatic hydrocarbons include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can be used. The aromatic hydrocarbon which has a hole mobility of higher than or equal to $1\times10^{-6}$ cm$^2$/Vs and which has 14 to 42 carbon atoms is particularly preferable.

The aromatic hydrocarbon may have a vinyl skeleton. As aromatic hydrocarbon having a vinyl group, the following are given, for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD) can also be used.

Here, as the substance having a hole-transport property, which is used for the charge generation region 104, a substance which does not have an amine skeleton is more preferably used. In the case where the charge generation region 104 is formed by using the acceptor substance and the substance having a hole transport property which does not have an amine skeleton, absorption based on charge transfer interaction is hard to occur as compared to the case where the substance having a hole-transport property has an amine skeleton. Although absorption based on charge transfer interaction does not occur, the charge generation region 104 can sufficiently function as a charge generation region. Hence, the charge generation region 104 which does not have an absorption peak in the visible light region and functions as a charge generation region can easily be formed, whereby a reduction in emission efficiency due to absorption of light can be prevented.

Note that examples of the substance having a hole-transport property which does not have an amine skeleton include the above-described carbazole derivatives such as CBP, TCPB, CzPA, 9-phenyl-3-[4-(10-phenyl-9-anthryl) phenyl]-9H-carbazole (abbreviation: PCzPA), and 1,4-bis[4-(N-carbazolyl)phenyl]-2,3,5,6-tetraphenylbenzene; and aromatic hydrocarbon such as t-BuDNA, DPPA, t-BuDBA, DNA, DPAnth, t-BuAnth, DMNA, 2-tert-butyl-9,10-di(1-naphthyl)anthracene, 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, DPVBi, and DPVPA. Further, a polymer of a carbazole derivative, such as PVK, may be used.

For the charge generation region 104, a composite material is preferably used, in which the acceptor substance and the substance having a hole-transport property are contained so that the mass ratio of the acceptor substance to the substance having a hole-transport property is greater than or equal to 0.1:1 and less than or equal to 4.0:1.

The charge generation region 104 can be formed to a thickness of greater than or equal to 10 nm and less than or equal to 200 nm. When the charge generation region 104 is formed by using a composite material of the substance having a hole-transport property and the acceptor substance, a change in conductivity is small even when the thickness of the charge generation region 104 is increased; thus, increase in drive voltage of the light-emitting element due to increase in the thickness of the charge generation region 104 can be suppressed. When the charge generation region 104 is formed by using such a material, by adjusting the thickness of the charge generation region 104, optical adjustment of the light-emitting element can be performed without increase in drive voltage.

The charge generation region 104 is not limited to the structure in which one film contains the substance having a hole-transport property and the acceptor substance, and can be a stack of a layer containing the substance having a hole-transport property and a layer containing the acceptor substance. Note that in the case of a stacked structure, in the m-th charge generation region 104m, a layer containing the substance having a hole-transport property is formed in contact with the (m+1)-th light-emitting unit 102m+1, and a layer containing the acceptor substance is formed in contact with the m-th electron-injection buffer region 105m.

In the electron-injection buffer region 105, at least an alkali metal layer is formed in contact with the light-emitting unit 102. As the alkali metal, lithium and a compound of lithium are preferable; specifically, lithium, lithium fluoride, lithium oxide, and the like can be used. The thickness of the alkali metal layer may be 1 nm to 10 nm in order to suppress crosstalk. In addition, since the alkali metal layer is very thin, it is not necessarily continuous throughout the pixel portion and may be partly divided into an island shape.

In the electron-injection buffer region 105, an electron-relay region may be formed to prevent the interaction between the alkali metal layer and the charge generation region. The electron-relay region is formed between the alkali metal layer and the charge generation region and has functions of accepting electrons generated in the charge generation region 104 and donating the electrons to the layer 106 containing NBPhen of the light-emitting unit 102. In addition, the electron-relay region contains at least a substance having an electron-transport property.

Here, the electron-relay region is formed so that the LUMO level of the substance having an electron-transport property contained in the electron-relay region can be a level between the acceptor level of the acceptor substance in the charge generation region 104 and the LUMO level of the layer 106 containing NBPhen. As a specific value of the energy level, the LUMO level of the substance having an electron-transport property contained in the electron-relay region is preferably higher than or equal to −5.0 eV, more preferably higher than or equal to −5.0 eV and lower than or equal to −3.0 eV.

As the substance having an electron-transport property in the electron-injection buffer region, a phthalocyanine-based material or a metal complex having a metal-oxygen bond and an aromatic ligand is preferably used.

In the case where a phthalocyanine-based material is used, specifically, any of copper(II) phthalocyanine (abbreviation: CuPc), phthalocyanine (abbreviation: $H_2Pc$), phthalocyanine tin(II) complex (abbreviation: SnPc), phthalocyanine zinc complex (abbreviation: ZnPc), cobalt(II) phthalocyanine, β-form (abbreviation: CoPc), phthalocyanine iron (abbreviation: FePc), and vanadyl 2,9,16,23-tetraphenoxy-29H, 31H-phthalocyanine (abbreviation: PhO-VOPc) is preferably used.

When a metal complex having a metal-oxygen bond and an aromatic ligand is used, a metal complex having a metal-oxygen double bond is preferable. In addition, as a metal complex having a metal-oxygen bond and an aromatic ligand, a phthalocyanine-based material is also preferable. Specifically, any of vanadyl phthalocyanine (abbreviation: VOPc), a phthalocyanine tin(IV) oxide complex (abbreviation: SnOPc), and a phthalocyanine titanium oxide complex (abbreviation: TiOPc) is preferable because a metal-oxygen double bond is more likely to act on another molecule in terms of a molecular structure and an acceptor property is high.

Note that the phthalocyanine-based material preferably has a phenoxy group. Specifically, a phthalocyanine derivative having a phenoxy group such as PhO-VOPc is preferable.

The electron-relay region may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay region, electrons can be transferred easily and the light-emitting element can be driven at lower voltage.

When a donor substance is contained in the electron-relay region, as the substance having an electron-transport property contained in the electron-relay region, a substance with a LUMO level higher than the acceptor level of the acceptor substance contained in the charge-generation region can be used, in addition to the above-described materials. As a specific energy level, the LUMO level is higher than or equal to −5.0 eV, preferably higher than or equal to −5.0 eV and lower than or equal to −3.0 eV. Examples of such a substance include a perylene derivative and a nitrogen-containing condensed aromatic compound. Note that a nitrogen-containing condensed aromatic compound is preferably used for the electron-relay region because of its stability. Furthermore, among nitrogen-containing condensed aromatic compounds, a structure in which a compound having an electron-withdrawing group such as a cyano group or a fluoro group is used is a preferable structure because electrons are easily accepted in the electron-relay region.

As specific examples of the perylene derivative, the following can be given: 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pyrazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl C$_{61}$ butyric acid methyl ester), and the like can be used.

In the case where a donor substance is contained in the electron-relay region, the electron-injection buffer region may be formed by a method such as co-evaporation of the substance having an electron-transport property and the donor substance. In the case where the donor substance is contained, the electron-relay region is preferably formed to a thickness of 1 nm to 10 nm, in which case generation of crosstalk due to the electron-relay region can be suppressed. For the same reason, the electron-relay region preferably contains the donor substance so that the mass ratio of the donor substance to the substance having an electron-transport property is greater than or equal to 0.001:1 and less than or equal to 0.1:1.

Each of the light-emitting units is formed by stacking a plurality of layers each having a different function, and includes at least a light-emitting layer (not illustrated) containing a light-emitting substance and the layer containing NBPhen.

The layer 106 containing NBPhen functions as part of an electron-transport layer and is in contact with the electron-injection buffer region 105. With this structure, interference in the adjacent pixel can be effectively reduced even in a high-definition display.

The electron-transport layer includes the layer containing NBPhen on the cathode 101 side and a layer containing a substance having an electron-transport property on the anode 100 side. The following are examples of the substance having an electron-transport property contained in the layer on the anode side of the electron-transport layer: a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI) or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTP-DBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); and an anthracene derivative such as CzPA, PCzPA, 3,6-diphenyl-9-[4-(10-phenyl-9-anthryl)phenyl]-9H-carbazole (abbreviation: DPCzPA), DPPA, DNA, t-BuDNA, or 7-[4-(10-phenyl-9-anthryl)phenyl]-7H-dibenzo[c,g]carbazole (abbreviation: cgDBCzPA). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The layer containing a substance having an electron-transport property formed on the anode 100 side of the electron-transport layer (the layer in contact with the anode side of the layer containing NBPhen) is preferably a layer containing a condensed aromatic compound or a condensed heteroaromatic compound because heat resistance of the light-emitting element can be improved. The condensed aromatic compound or the condensed heteroaromatic compound preferably has three or more condensed rings. This structure functions more effectively when the layer in contact with the anode side of the layer containing NBPhen contains the condensed heteroaromatic compound. That is, even when the condensed heteroaromatic compound that is less stable than the condensed aromatic compound is used, by stacking the condensed heteroaromatic compound and the layer containing NBPhen, heat resistance as in the case of stacking the condensed aromatic compound and the layer containing NBPhen can be achieved. As the condensed heteroaromatic compound, a compound including two nitrogen atoms in one condensed ring is preferable.

A light-emitting region corresponds to the layer containing a light-emitting substance which may be formed in contact with the electron-transport layer or in the electron-transport layer. The light-emitting substance can be a fluorescent compound or a phosphorescent compound which is described below.

Examples of the fluorescent compound include: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenylpyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

As the fluorescent compound, a substance exhibiting thermally activated delayed fluorescence (TADF) can also be used. As a material exhibiting TADF, materials given below can be used.

A fullerene, a derivative thereof, an acridine derivative such as proflavine, and eosin can be given. Further, a metal-containing porphyrin, such as a porphyrin containing magnesium (Mg), zinc (Zn), cadmium (Cd), tin (Sn), platinum (Pt), indium (In), or palladium (Pd) can be given. Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$(OEP)), which are represented by the following structural formulae.

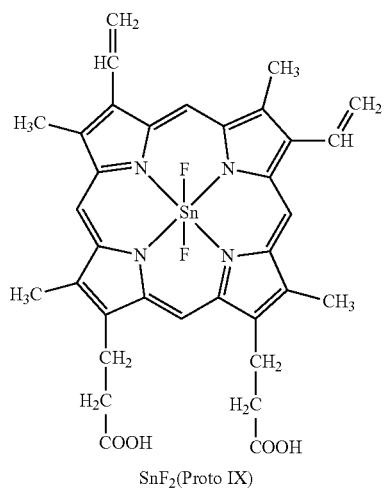

$SnF_2$(Proto IX)

-continued

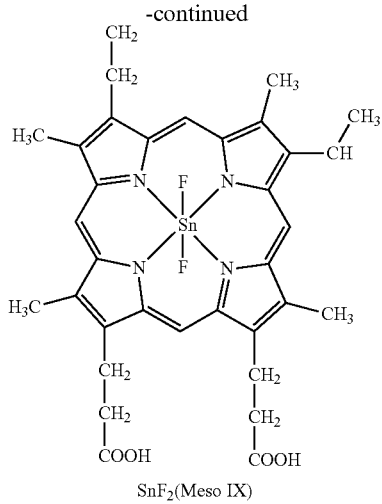

SnF₂(Meso IX)

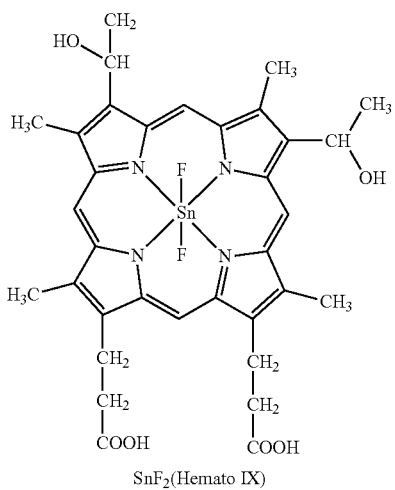

SnF₂(Hemato IX)

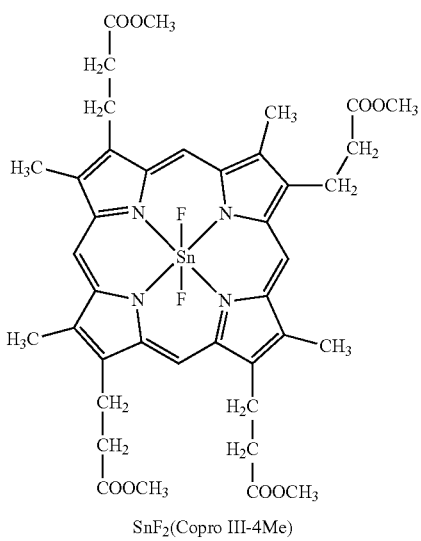

SnF₂(Copro III-4Me)

-continued

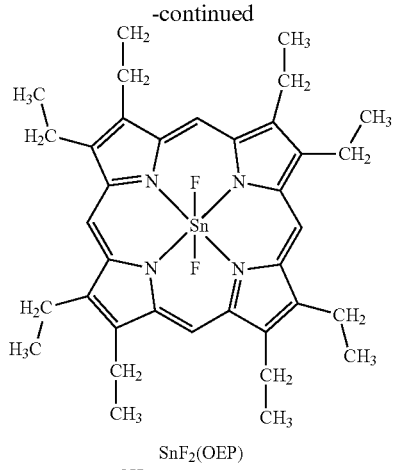

SnF₂(OEP)

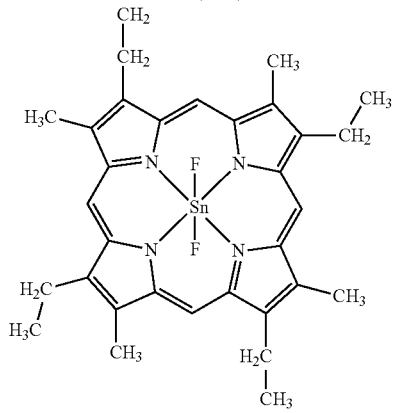

SnF₂(Etio I)

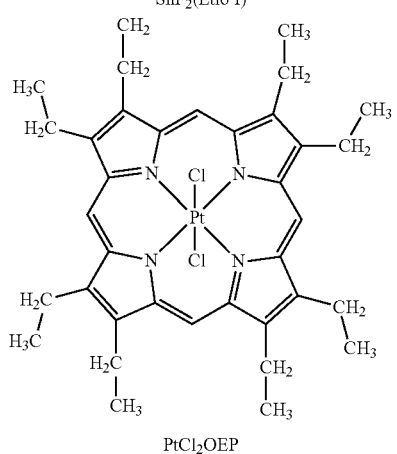

PtCl₂OEP

Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ), which is shown by the structural formula given below. The heterocyclic compound is preferably used, because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

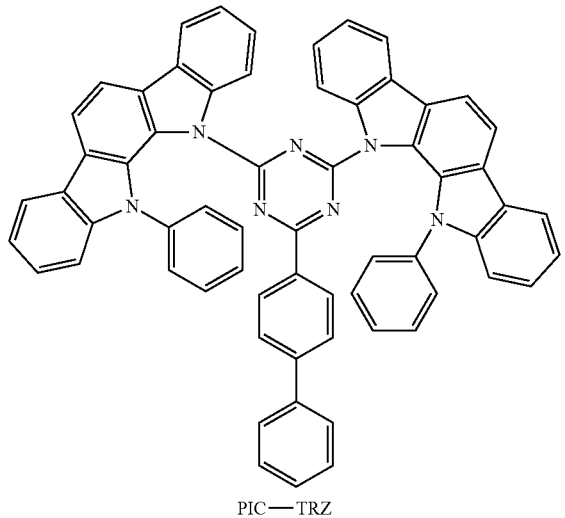

PIC—TRZ

As examples of the phosphorescent substance, the following can be given: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIr(acac)). These are compounds emitting blue phosphorescence and have an emission peak at 440 nm to 520 nm.

Further, the following can be used: an organometallic iridium complex having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), bis[2-(6-tert-butyl-4-pyrimidinyl-κN3)phenyl-κC](2,4-pentanedionato-κ$^2$O,O') iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), or (acetylacetonato)bis(4,6-diphenylpyrimidinato)iridium(III) (abbreviation: Ir(dppm)$_2$(acac)); an organometallic iridium complex having a pyrazine skeleton, such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), or bis(2-phenylquinolinato-N,C$^{2'}$)iridium(III) acetylacetonate (abbreviation: Ir(pq)$_2$(acac)); and a rare earth metal complex such as tris(acetylacetonato)(monophenanthroline)terbium(III) (abbreviation: Tb(acac)$_3$(Phen)). These are mainly compounds emitting green phosphorescence and have an emission peak at 500 nm to 600 nm. Note that an organometallic iridium complex having a pyrimidine skeleton has distinctively high reliability and emission efficiency and thus is especially preferable.

Further, the following can be used: an organometallic iridium complex having a pyrimidine skeleton, such as bis[4,6-bis(3-methylphenyl)pyrimidinato](diisobutyrylmethano)iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); an organometallic iridium complex having a pyridine skeleton such as tris(1-phenylisoquinolinato-N,C$^{2'}$)iridium(III) (abbreviation: Ir(piq)$_3$) or bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: Eu(DBM)$_3$(Phen)) or tris[1-(2-thenoyl)-3,3,3-trifluoroacetonato](monophenanthroline)europium(III) (abbreviation: Eu(TTA)$_3$(Phen)). These are compounds emitting red phosphorescence and have an emission peak at 600 nm to 700 nm. Further, the organometallic iridium complexes having pyrazine skeletons can provide red light emission with favorable chromaticity.

Various phosphorescent materials, other than the phosphorescent compounds given above, may also be selected and used.

Note that the light-emitting region preferably has a structure in which these light-emitting substances are dispersed in a host material. In addition to the substances given as the substance having an electron-transport property contained in the electron-transport layer, a substance having a hole-transport property can also be used. As the substance having a hole-transport property, the substances given as the substance having a hole-transport property that can be used in the charge generation layer can be used. The following are preferably used: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

At least one light-emitting region may be included in each of the light-emitting units. Alternatively, a plurality of light-emitting layers containing different light-emitting substances and/or host materials or a plurality of light-emitting layers containing the same light-emitting substance and host material but in different concentrations may be included in each of the light-emitting units. Needless to say, structures of light-emitting layers in the light-emitting units may be the same or different from each other.

Other than the electron-transport layer and the light-emitting layer included in each of the light-emitting units, a layer containing a hole-injection substance and having a hole-injection property (a hole-injection layer), a layer containing a hole-transport substance and having a hole-transport property (a hole-transport layer), a layer containing a bipolar substance and having a bipolar property (having both an electron-transport property and a hole-transport property), and the like can be given. Each of the light-emitting units can be formed by using combination of the above layers and other various functional layers as appropriate. Note that in the n-th light-emitting unit $102n$ which is in contact with the cathode 101, a layer containing an electron-injection substance and having an electron-injection property (an electron-injection layer) may be further provided as a layer which is the closest to the cathode 101. Furthermore, a charge generation region may be provided between the first light-emitting unit $102k$ and the anode 100 and between the n-th light-emitting unit $102n$ and the cathode 101.

The hole-injection layer, the hole-transport layer, and the electron-injection layer will be described below.

The hole-injection layer is a layer containing a substance having a hole-injection property. As the substance having a hole-injection property, for example, a metal oxide such as molybdenum oxide, vanadium oxide, ruthenium oxide, tungsten oxide, or manganese oxide can be used. Alternatively, it is possible to use a phthalocyanine-based compound such as phthalocyanine (abbreviation: H$_2$Pc) or copper(II) phthalocyanine (abbreviation: CuPc). A polymer such as PEDOT/PSS (abbreviation) can also be used.

The hole-transport layer is a layer containing a substance having a hole-transport property. As the substance having a hole-transport property contained in the hole-transport layer, a substance similar to the substance having a hole-transport property contained in the above charge generation region 104 can be used. Thus, the above description is referred to here. Note that the hole-transport layer may have a stacked structure of two or more layers containing the above substances as well as a single-layer structure.

The electron-injection layer which can be provided in the n-th light-emitting unit $102n$ contains a substance having an electron-injection property. As the substance having an electron-injection property, the following can be given: an alkali metal, an alkaline earth metal, and a compound of these metals, such as lithium fluoride (LiF), cesium fluoride (CsF), and calcium fluoride (CaF$_2$). Alternatively, a substance having an electron-transport property containing an alkali metal, an alkaline earth metal, or a compound of these metals (e.g., Alq (abbreviation) containing magnesium (Mg)) can be used as the substance having an electron-injection property. Such a structure makes it possible to increase the efficiency of electron injection from the cathode 101.

A charge generation region may be provided between the first light-emitting unit $102k$ and the anode 100 or between the n-th light-emitting unit $102n$ and the cathode 101. In the case where a charge generation region is provided between the first light-emitting unit $102k$ and the anode 100 or between the n-th light-emitting unit $102n$ and the cathode 101, the charge generation region is formed using a composite material containing a substance having a hole-transport property and an acceptor substance. The charge generation region is not limited to containing the substance having a hole-transport property and the acceptor substance in the same film, and may be a stack of a layer containing the substance having a hole-transport property and a layer containing the acceptor substance. Note that, in the case of the stacked structure, the layer containing an acceptor substance is in contact with the anode 100 or the cathode 101.

When a charge generation region is provided between the first light-emitting unit $102k$ and the anode 100 or between the n-th light-emitting unit $102n$ and the cathode 101, the anode 100 or the cathode 101 can be formed without consideration of a work function of a substance for forming the electrodes. Note that a structure and a substance similar to those of the above charge generation region 104 can be used for the charge generation region which is provided between the first light-emitting unit $102k$ and the anode 100 or between the n-th light-emitting unit $102n$ and the cathode 101. Therefore, the above description is referred to.

Note that each of the light-emitting units can be formed by stacking the above layers in appropriate combination. As a formation method of each of the light-emitting units, a variety of methods (e.g., a dry process such as a vacuum evaporation method, a wet process such as an ink-jet method or a spin coating method, or the like) can be used depending on a material to be used. Each layer may be formed by a different formation method.

The anode 100 is preferably formed using a metal, an alloy, a conductive compound, a mixture thereof, or the like which has a high work function (specifically, a work function of higher than or equal to 4.0 eV). Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, indium oxide containing tungsten oxide and zinc oxide (IWZO) can be deposited by a sputtering method by using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Graphene can also be used.

The cathode 101 can be formed by using a metal, an alloy, an electrically conductive compound, a mixture thereof, or the like that has a low work function (specifically, a work function of lower than or equal to 3.8 eV). Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the cathode 101 and the electron-transport layer, any of a variety of conductive materials such as Al, Ag, ITO, indium oxide-tin oxide containing silicon or silicon oxide, and the like can be used regardless of its work function as the cathode 101. These conductive materials can be deposited by a sputtering method, an ink-jet method, a spin coating method, or the like.

Note that in the light-emitting element described in this embodiment, at least one of the anode 100 and the cathode 101 may have a property of transmitting visible light. The light-transmitting property can be ensured by using a transparent electrode such as ITO or by reducing the thickness of an electrode. Alternatively, a stacked structure of a thin material and a transparent electrode may be used.

In addition, a conductive layer for controlling the optical path length of the light-emitting element may be formed between the anode 100 and the light-emitting unit or between the cathode 101 and the light-emitting unit by using a light-transmitting conductive material such as ITO.

Since the light-emitting element of this embodiment includes a plurality of light-emitting units, light that is a combination of light emitted from respective light-emitting units can be obtained. In other words, in the case where a plurality of light-emitting units each including a light-emitting layer containing the same light-emitting substance is stacked, higher luminance can be obtained as compared to a light-emitting element formed by using only one light-emitting unit when the current density is the same. Further, in the case where the light-emitting element of this embodiment is formed by stacking the light-emitting units containing light-emitting substances exhibiting different emission colors, a light-emitting element having a broad spectrum or a light-emitting element exhibiting white light emission can be obtained. A display including a light-emitting element exhibiting white light emission and a color filter is advantageous in achieving higher definition.

Therefore, even when the light-emitting element having the above structure in this embodiment in which a plurality of light-emitting units is separated from each other by a charge generation layer is used in a high-definition display (e.g., a distance between light-emitting regions of adjacent light-emitting elements is shorter than or equal to 40 μm), an interference phenomenon between the adjacent light-emitting elements can be effectively reduced without great increase in driving voltage and the display can provide a high-quality image. Note that the light-emitting element in which a plurality of light-emitting units is separated from each other by a charge generation region is a light-emitting element which easily realizes a high current efficiency, a broad emission spectrum, or white light emission.

Embodiment 2

This embodiment shows a light-emitting device including the light-emitting element described in Embodiment 1.

In this embodiment, the light-emitting device manufactured by using the light-emitting element described in Embodiment 1 will be described with reference to FIGS. 2A and 2B. FIG. 2A is a top view illustrating the light-emitting device, and FIG. 2B is a cross-sectional view of FIG. 2A taken along lines A-B and C-D. This light-emitting device includes a driver circuit portion (source line driver circuit) 601, a pixel portion 602, and a driver circuit portion (gate line driver circuit) 603, which are to control light emission of a light-emitting element and illustrated with dotted lines. A reference numeral 604 denotes a sealing substrate; 605 denotes a sealant; and a portion surrounded by the sealant 605 is a space 607.

A lead wiring 608 is a wiring for transmitting signals to be input to the source line driver circuit 601 and the gate line driver circuit 603 and receiving a video signal, a clock signal, a start signal, a reset signal, and the like from an FPC (flexible printed circuit) 609 serving as an external input terminal. Although only the FPC is shown here, the FPC may be provided with a printed wiring board (PWB). The light-emitting device in this specification includes not only a main body of the light-emitting device but also the light-emitting device with an FPC or a PWB attached.

Next, a cross-sectional structure will be described with reference to FIG. 2B. The driver circuit portion and the pixel portion are formed over an element substrate 610; FIG. 2B shows the source line driver circuit 601, which is a driver circuit portion, and one of the pixels in the pixel portion 602.

As the source line driver circuit 601, a CMOS circuit in which an n-channel TFT 623 and a p-channel TFT 624 are combined is formed. The driver circuit may be formed with various types of CMOS circuits, PMOS circuits, or NMOS circuits. A driver integration type in which a driver circuit is formed over a substrate is described in this embodiment, but it is not necessarily required and a driver circuit can be formed outside a substrate, not over the substrate.

The pixel portion 602 includes a plurality of pixels, each of which includes a switching TFT 611, a current control TFT 612, and a first electrode 613 which is electrically connected to a drain of the current control TFT 612. Note that an insulator 614 is formed to cover an edge of the first electrode 613. Here, a positive type photosensitive acrylic resin film is used to form the insulator 614.

The insulator 614 is formed to have a curved surface with curvature at an upper edge or a lower edge thereof in order to obtain favorable coverage. For example, in the case of using positive type photosensitive acrylic as a material of the insulator 614, the insulator 614 is preferably formed to have a curved surface with a curvature radius (0.2 μm to 3 μm) only at an upper edge. As the insulator 614, either a negative type photosensitive resin or a positive type photosensitive resin can be used.

An EL layer 616 and a second electrode 617 are formed over the first electrode 613. In this case, it is preferable that the first electrode 613 serving as an anode be formed by using a material with a high work function. For example, a single-layer film of an ITO film, an indium tin oxide film containing silicon, an indium oxide film containing 2 wt % to 20 wt % of zinc oxide, a titanium nitride film, a chromium film, a tungsten film, a Zn film, a Pt film, or the like can be used. Besides these single-layer films, a stack of a titanium nitride film and a film containing aluminum as its main component, a stack of three layers of a titanium nitride film, a film containing aluminum as its main component, and a titanium nitride film, or the like can be used. When the first electrode 613 has a stacked structure, resistance as a wiring is low, a good ohmic contact is formed, and further, the first electrode 613 can be made to function as an anode.

In addition, the EL layer 616 is formed by various methods such as an evaporation method using an evaporation mask, an ink-jet method, or a spin coating method. The EL layer 616 has the structure described in Embodiment 1. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. When light generated in the EL layer 616 passes through the second electrode 617, the second electrode 617 is preferably formed from a stack of a thin metal film and a transparent conductive film (ITO, indium oxide containing 2 wt % to 20 wt % of zinc oxide, indium tin oxide containing silicon, zinc oxide (ZnO), or the like).

Note that the light-emitting element is formed with the first electrode 613, the EL layer 616, and the second electrode 617. The light-emitting element has the structure described in Embodiment 1. In the light-emitting device in this embodiment, the pixel portion, which includes a plurality of light-emitting elements, may include both the light-emitting element described in Embodiment 1 and a light-emitting element having a different structure.

By attaching the sealing substrate 604 to the element substrate 610 with the sealant 605, a light-emitting element 618 is provided in the space 607 surrounded by the element substrate 610, the sealing substrate 604, and the sealant 605. The space 607 is filled with filler, but there is also a case where the space 607 is filled with an inert gas (nitrogen, argon, or the like) or filled with the sealant 605. It is preferable that the sealing substrate be provided with a recessed portion and a drying agent be provided in the recessed portion, in which case deterioration due to influence of moisture can be suppressed.

An epoxy-based resin or glass frit is preferably used for the sealant 605. Such a material preferably allows as little moisture and oxygen as possible to penetrate. As the sealing substrate 604, a glass substrate, a quartz substrate, or a plastic substrate formed of fiber reinforced plastic (FRP), poly(vinyl fluoride) (PVF), polyester, acrylic, or the like can be used.

In this manner, it is possible to obtain the light-emitting device using the light-emitting element described in Embodiment 1.

Since the light-emitting device in this embodiment is formed by using the light-emitting element described in Embodiment 1, a light-emitting device having favorable characteristics can be provided. Specifically, since the light-emitting element described in Embodiment 1 has favorable emission efficiency, the light-emitting device can have reduced power consumption. In addition, since the light-emitting element is easy to mass-produce, the light-emitting device can be provided at low cost.

FIGS. 3A and 3B each illustrate an example of a light-emitting device in which full color display is achieved by formation of a light-emitting element exhibiting white light emission and using coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, an EL layer 1028, a second electrode 1029 of the light-emitting elements, a sealing substrate 1031, a sealant 1032, and the like are illustrated.

In FIG. 3A, coloring layers (a red coloring layer 1034R, a green coloring layer 1034G, and a blue coloring layer 1034B) are provided on a transparent base material 1033. Further, a black layer (black matrix) 1035 may be provided. The transparent base material 1033 provided with the coloring layers and the black layer is positioned and fixed to the substrate 1001. Note that the coloring layers and the black layer are covered with an overcoat layer 1036. In FIG. 3A, light emitted from some of the light-emitting layers does not pass through the coloring layers, while light emitted from the others of the light-emitting layers passes through the coloring layers. Since light which does not pass through the coloring layers is white and light which passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

Figure 4:
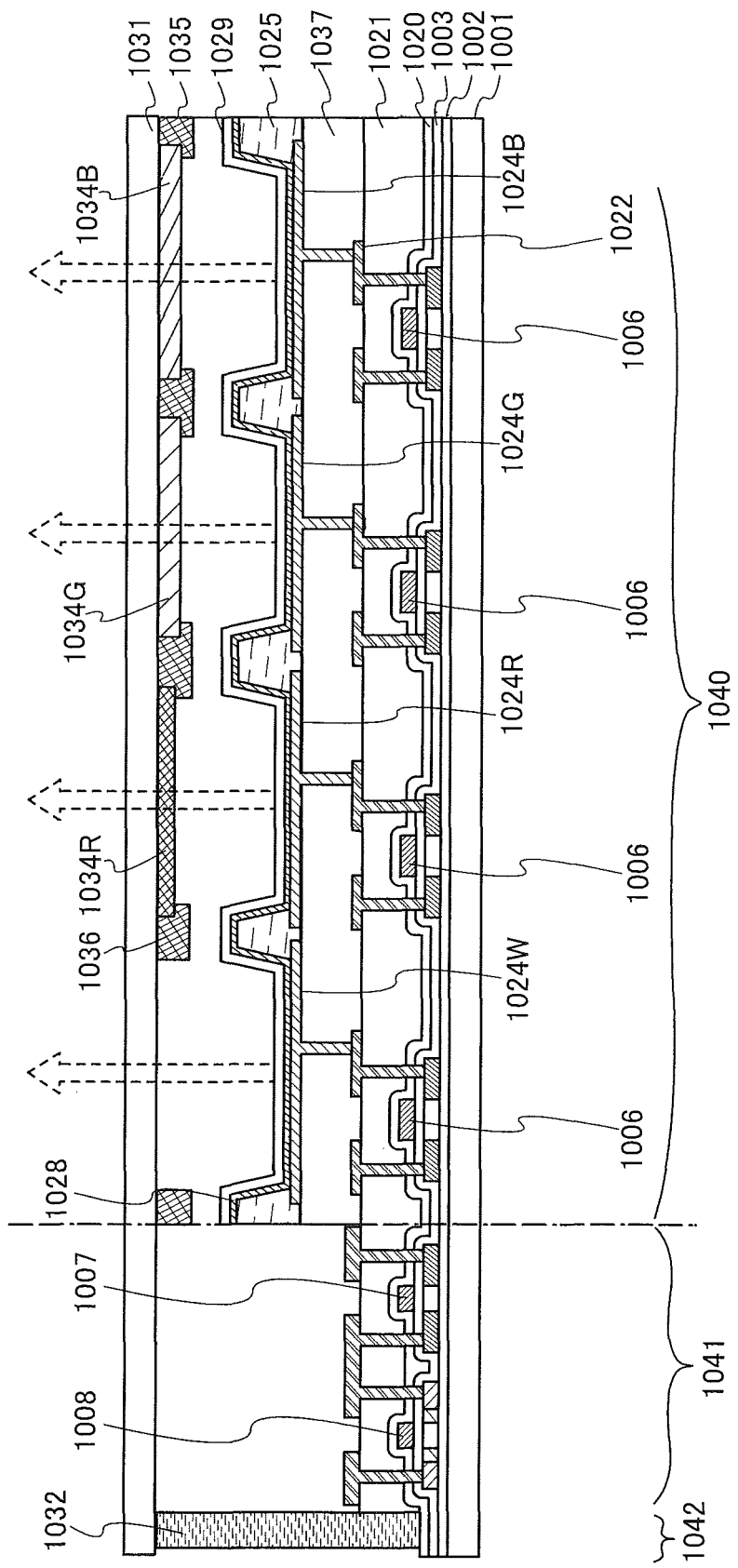
FIG. 4 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, as the substrate 1001, a substrate that does not transmit light can be used. The process up to the step of forming a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may function for planarization. The third interlayer insulating film 1037 can be formed by using a material similar to that of the second interlayer insulating film, or can be formed by using any other known materials.

The first electrodes 1024W, 1024R, 1024G, and 1024B of the light-emitting elements each serve as an anode here, but may serve as a cathode. Further, in the case of a light-emitting device having a top emission structure as illustrated in FIG. 4, the first electrodes are preferably reflective electrodes. The EL layer 1028 is formed to have a structure similar to the structure of the EL layer 110, which is described in Embodiment 1 and with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The black layer (black matrix) 1035 may be provided on the sealing substrate 1031 so as to be located between the pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

Further, although an example in which full color display is performed using four colors of red, green, blue, and white is shown here, there is no particular limitation and full color display may be performed using three colors of red, green, and blue.

Since the light-emitting device in this embodiment is formed using the light-emitting element described in Embodiment 1, a light-emitting device having favorable characteristics can be provided. Specifically, since the light-emitting element described in Embodiment 1 has favorable emission efficiency, the light-emitting device can have reduced power consumption. In addition, since the light-emitting element is easy to mass-produce, the light-emitting device can be provided at low cost.

Since many minute light-emitting elements arranged in a matrix in the light-emitting device described above can each be controlled, the light-emitting device can be suitably used as a display device for displaying images.

This embodiment can be freely combined with any of the other embodiments.

Embodiment 3

In this embodiment, examples of an electronic device including the light-emitting element described in Embodiment 1 as part thereof will be described. The light-emitting element described in Embodiment 1 has high emission efficiency and consumes low power, and by using the light-emitting element, a display can provide high display quality. As a result, the electronic devices described in this embodiment can each have a display portion having high display quality and reduced power consumption.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

FIG. 5A illustrates an example of a television device. In the television device, a display portion 7103 is incorporated in a housing 7101. In addition, here, the housing 7101 is supported by a stand 7105. Images can be displayed on the display portion 7103, and in the display portion 7103, the light-emitting elements described in Embodiment 1 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 5B1 illustrates a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 1. The computer illustrated in FIG. 5B1 may have a structure illustrated in FIG. 5B2. The computer illustrated in FIG. 5B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touch screen. Connecting the two screens with a hinge can prevent troubles; for example, the screens can be prevented from being cracked or broken while the computer is being stored or carried.

FIG. 5C illustrates a portable game machine having two housings, a housing 7301 and a housing 7302, which are connected with a joint portion 7303 so that the portable game machine can be opened or folded. A display portion 7304 including the light-emitting elements arranged in a matrix which are described in Embodiment 1 is incorporated in the housing 7301, and a display portion 7305 is incorporated in the housing 7302. In addition, the portable game machine illustrated in FIG. 5C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion including the light-emitting elements described in Embodiment 1 and arranged in a matrix is used as at least either the display portion 7304 or the display portion 7305, or both, and the structure can include other accessories as appropriate. The portable game machine illustrated in FIG. 5C has a function of reading out a program or data stored in a storage medium to display it on the display portion, and a function of sharing information with another portable game machine by wireless communication. The portable game machine illustrated in FIG. 5C can have a variety of functions without limitation to the above.

FIG. 5D illustrates an example of a mobile phone. The mobile phone is provided with a display portion 7402 incorporated in a housing 7401, an operation button 7403, an external connection port 7404, a speaker 7405, a microphone 7406, and the like. Note that the mobile phone 7400 has the display portion 7402 including the light-emitting elements described in Embodiment 1 and arranged in a matrix.

When the display portion 7402 of the mobile phone illustrated in FIG. 5D is touched with a finger or the like, data can be input into the mobile phone. In this case, operations such as making a call and creating an e-mail can be performed by touching the display portion 7402 with a finger or the like.

There are mainly three screen modes for the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 can function as an image sensor. For example, an image of a palm print, a fingerprint, or the like is taken by touch on the display portion 7402 with the palm or the finger, whereby personal authentication can be performed. Further, by providing a backlight or a sensing light source which emits near-infrared light in the display portion, an image of a finger vein, a palm vein, or the like can be taken.

Note that the structure described in this embodiment can be combined as appropriate with any of the structures described in the other embodiments.

As described above, the application range of the light-emitting device including the light-emitting elements described in Embodiment 1 is extremely wide; therefore, the light-emitting device can be applied to electronic devices of a variety of fields. By using the light-emitting elements described in Embodiment 1, electronic devices which can provide high-quality display and consumes low power can be obtained.

Figure 6:
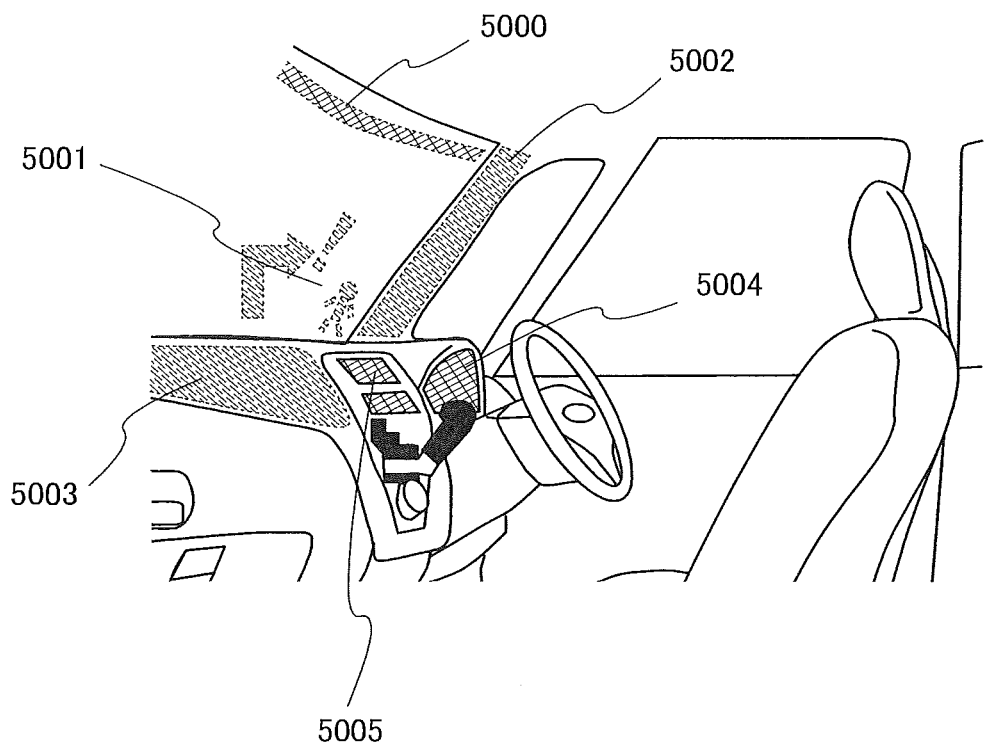
FIG. 6 illustrates in-vehicle display devices and lighting devices.

The light-emitting element described in Embodiment 1 can also be used for an automobile windshield or an automobile dashboard. FIG. 6 illustrates one mode in which the light-emitting elements described in Embodiment 1 are used for an automobile windshield and an automobile dashboard. Display regions 5000 to 5005 each include the light-emitting element described in Embodiment 1.

The display region 5000 and the display region 5001 are display devices which are provided in the automobile windshield and in which the light-emitting elements described in Embodiment 1 are incorporated. The light-emitting element described in Embodiment 1 can be formed into what is called a see-through display device, through which the opposite side can be seen, by including a first electrode and a second electrode formed of electrodes having light-transmitting properties. Such see-through display devices can be provided even in the automobile windshield without hindering the view. Further, in the case where a transistor for driving is provided, it is preferable to use a transistor having a light-transmitting property, such as an organic transistor using an organic semiconductor material or a transistor using an oxide semiconductor.

A display device incorporating the light-emitting element described in Embodiment 1 is provided in the display region 5002 in a pillar portion. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see, makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The contents or layout of the display can be changed by a user as appropriate. Note that such information can also be shown by the display regions 5000 to 5003. The display regions 5000 to 5005 can also be used as lighting devices.

The light-emitting element described in Embodiment 1 can have high emission efficiency and low power consumption. Therefore, load on a battery is small even when a number of large screens such as the display regions 5000 to 5005 are provided, which provides comfortable use. For that reason, the light-emitting device or the lighting device which includes the light-emitting element described in Embodiment 1 can be suitably used as an in-vehicle light-emitting device or an in-vehicle lighting device. Since the light-emitting element according to one embodiment of the present invention has high heat resistance, the light-emitting device which includes the light-emitting element described in Embodiment 1 is highly preferable as an in-vehicle display device which must resist high temperature particularly in summer.

Figure 7A:
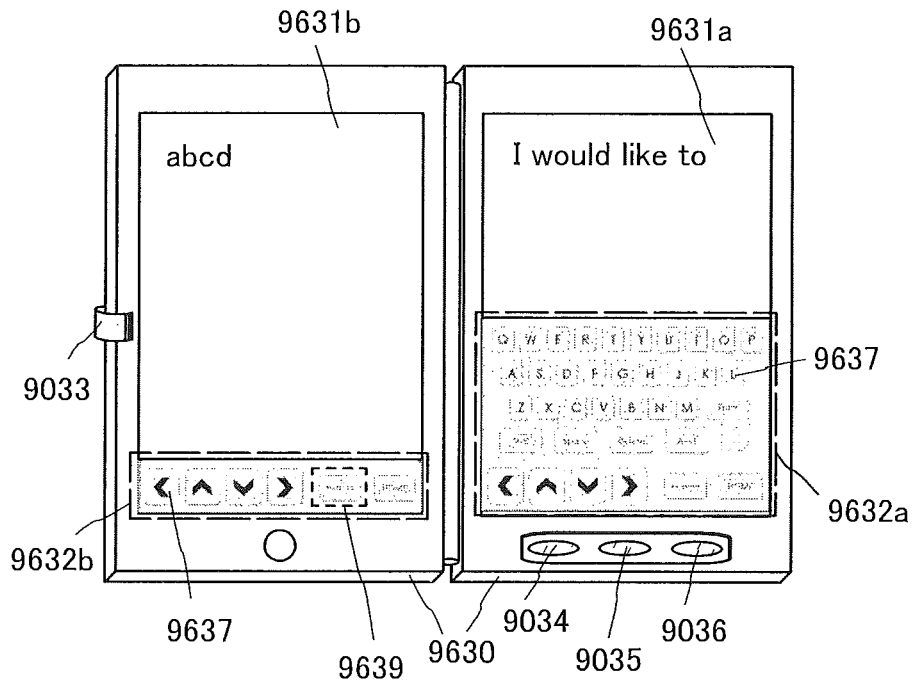
FIGS. 7A to 7C illustrate an electronic device.
Figure 7B:
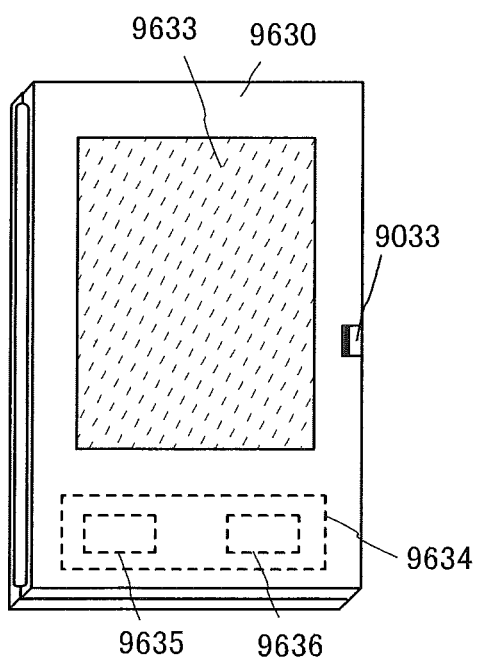

FIGS. 7A and 7B illustrate an example of a foldable tablet terminal. In FIG. 7A, the tablet terminal is opened, and includes a housing 9630, a display portion 9631*a*, a display portion 9631*b*, a switch 9034 for switching display modes, a power button 9035, a switch 9036 for switching to power-saving mode, and a clip 9033. Note that in the tablet terminal, one or both of the display portion 9631a and the display portion 9631b is/are formed using the light-emitting device which includes the light-emitting element described in Embodiment 1.

Part of the display portion 9631a can be a touch screen region 9632a and data can be input when a displayed operation key 9637 is touched. Note that, as an example, half of the area of the display portion 9631a has only a display function and the other half of the area has a touch screen function. However, the structure of the display portion 9631a is not limited to this, and all the area of the display portion 9631a may have a touch screen function. For example, all the area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch screen is touched with a finger, a stylus, or the like, a keyboard can be displayed on the display portion 9631b.

Touch input can be performed in the touch screen region 9632a and the touch screen region 9632b at the same time.

The switch 9034 for switching display modes can switch the display between portrait mode, landscape mode, and the like, and between monochrome display and color display, for example. The switch 9036 for switching to power-saving mode can control display luminance to be optimal in accordance with the amount of external light in use of the tablet terminal detected by an optical sensor incorporated in the tablet terminal. In addition to the optical sensor, other detecting devices such as sensors for determining inclination, such as a gyroscope or an acceleration sensor, may be incorporated in the tablet terminal.

Although the display portion 9631a and the display portion 9631b have the same display area in FIG. 7A, one embodiment of the present invention is not limited to this example. The display portion 9631a and the display portion 9631b may have different areas or different display quality. For example, one of the display portions 9631a and 9631b may display higher definition images than the other.

FIG. 7B illustrates the tablet terminal which is folded. The tablet terminal in this embodiment includes the housing 9630, a solar cell 9633, a charge and discharge control circuit 9634, a battery 9635, and a DCDC converter 9636. Note that FIG. 7B shows an example in which the charge and discharge control circuit 9634 includes the battery 9635 and the DCDC converter 9636.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

The tablet terminal illustrated in FIGS. 7A and 7B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by using various kinds of software (programs).

The solar cell 9633, which is attached on the surface of the tablet terminal, supplies power to a touch screen, a display portion, an image signal processor, and the like. Note that the solar cell 9633 is preferably provided on one or two surfaces of the housing 9630, in which case the battery 9635 can be charged efficiently.

Figure 7C:
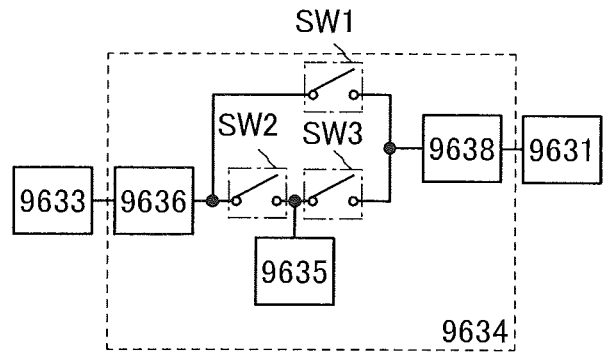

The structure and the operation of the charge and discharge control circuit 9634 illustrated in FIG. 7B will be described with reference to a block diagram in FIG. 7C. FIG. 7C illustrates the solar cell 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 7B.

First, an example of operation in the case where power is generated by the solar cell 9633 using external light is described. The voltage of power generated by the solar cell is raised or lowered by the DCDC converter 9636 so that the power has a voltage for charging the battery 9635. Then, when power supplied by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and the switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module which is capable of charging by transmitting and receiving power by wireless (without contact), or another charge means used in combination, and the power generation means is not necessarily provided.

One embodiment of the present invention is not limited to the tablet terminal having the shape illustrated in FIGS. 7A to 7C as long as the display portion 9631 is included.

Example 1

Figure 13:
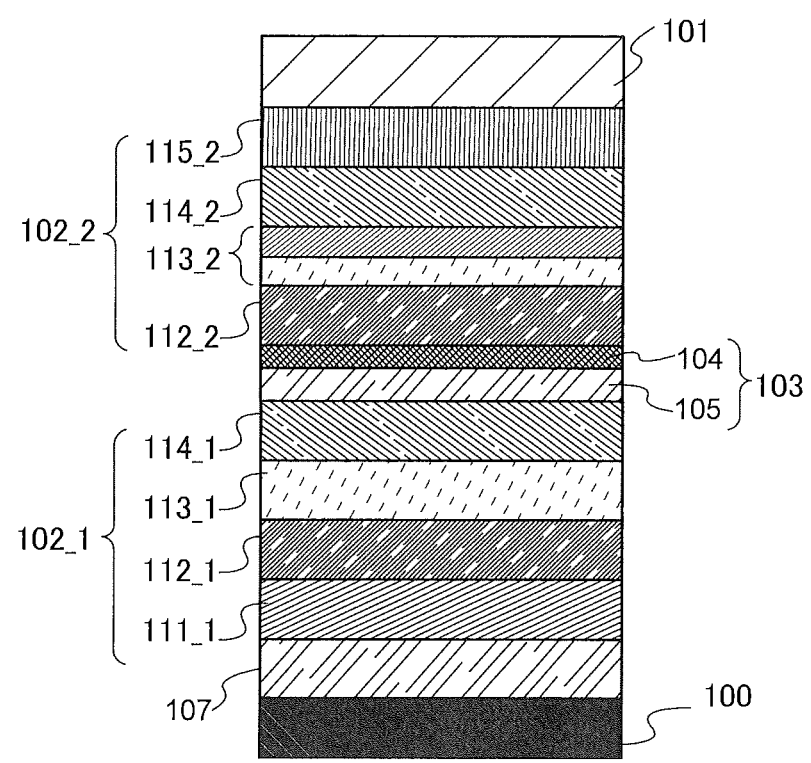
FIG. 13 illustrates an element structure of a light-emitting element.

In this example, a light-emitting element according to one embodiment of the present invention (example elements 1-R, 1-G, and 1-B) and a comparative example (comparative example elements 1-R, 1-G, and 1-B) will be described. An element structure is shown in FIG. 13. In this example and the comparative example, display devices were fabricated by using the above-described elements and then evaluated. In order to fabricate the display devices, for both the example element 1 and the comparative example element 1, a color filter and a resonant structure were used and three kinds of pixels, a red pixel, a green pixel, and a blue pixel, were used. Chemical formulae of organic compounds used in the example elements 1-R, 1-G, and 1-B and the comparative example elements 1-R, 1-G, and 1-B are shown below.

(i)
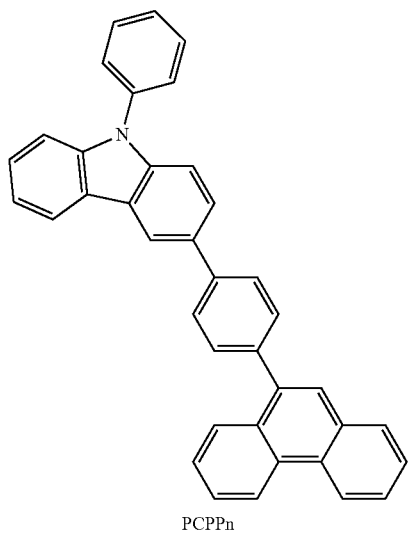
PCPPn
(ii)
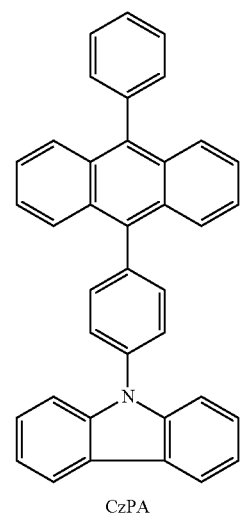
CzPA
(iii)
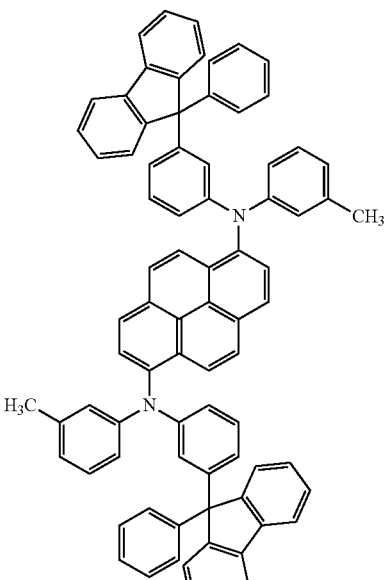
1,6mMemFLPAPrn
(iv)
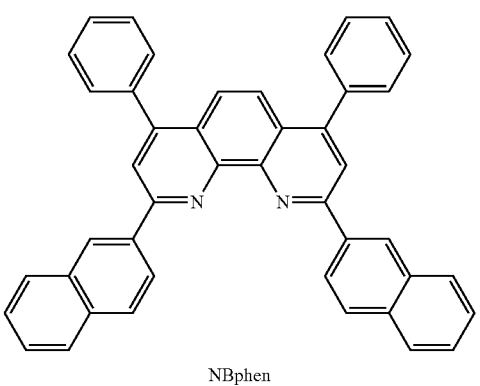
NBphen
(v)
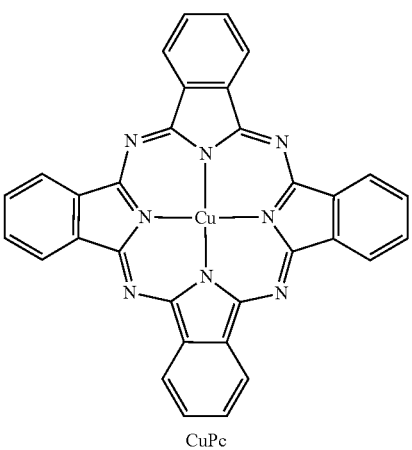
CuPc -continued
(vi)
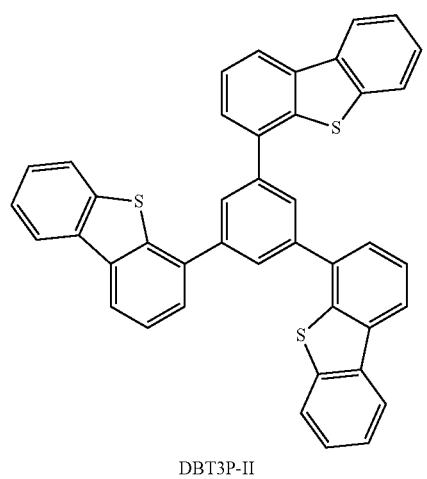
DBT3P-II
(vii)
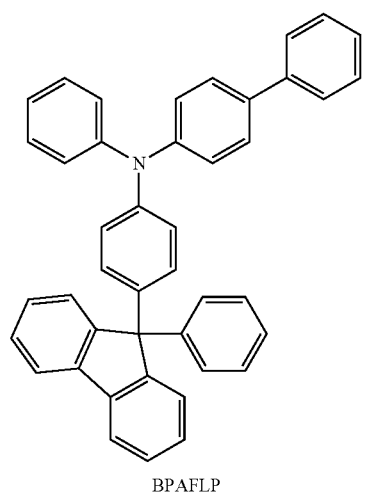
BPAFLP
(viii)
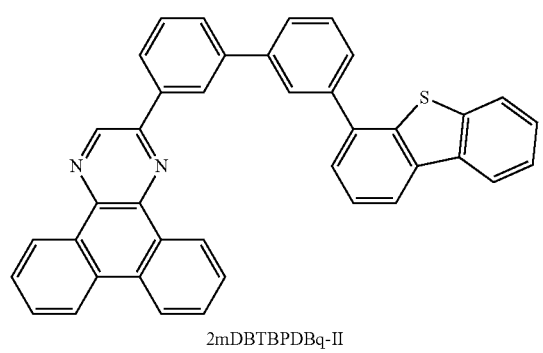
2mDBTBPDBq-II
-continued
(ix)
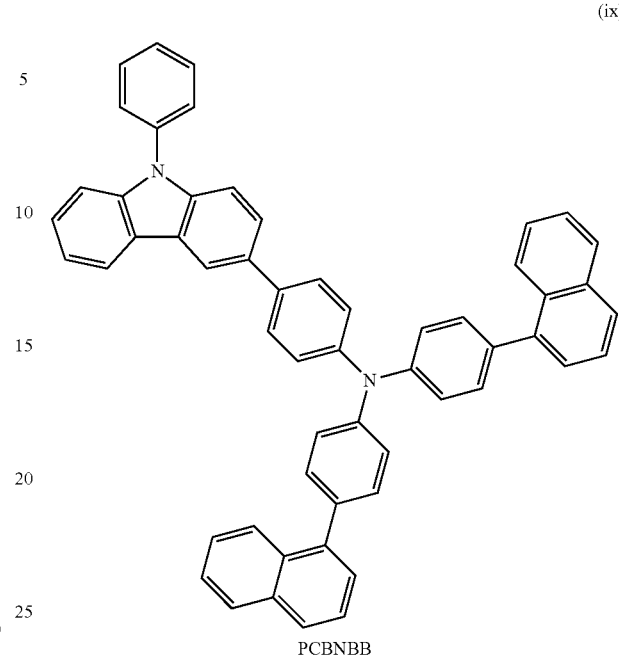
PCBNBB
(x)
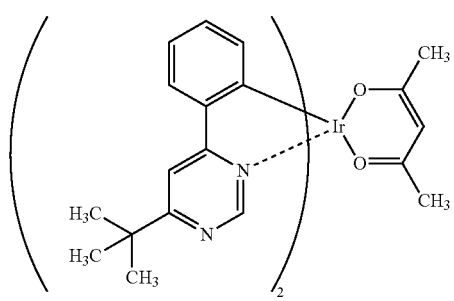
[Ir(tBuppm)$_2$(acac)]
(xi)
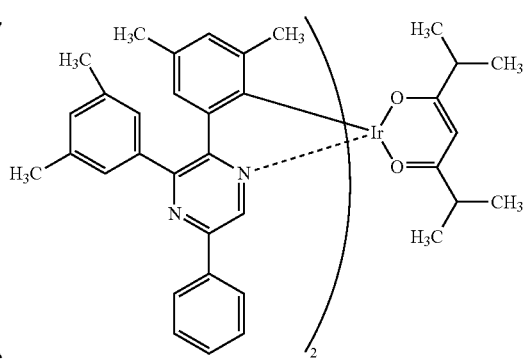
[Ir(dmdppr-P)$_2$(dibm)]

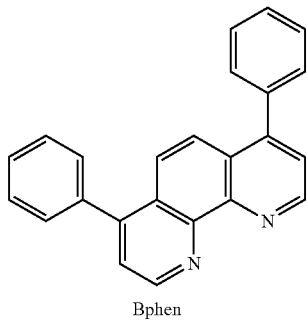

Bphen

Now, a method for fabricating the light-emitting element of this example (the example elements 1-R, 1-G, and 1-B) will be described.

(Method for Fabricating the Example Elements 1-R, 1-G, and 1-B)

Over a substrate formed of glass, an aluminum-nickel-lanthanum alloy film and a titanium film were sequentially formed by a sputtering method, whereby an anode 100 was formed. The thickness of the aluminum-nickel-lanthanum alloy film was 200 nm and the thickness of the titanium film was 6 nm. In addition, the electrode area was 2 mm×2 mm.

Then, indium tin oxide containing silicon oxide (ITSO) was deposited over the anode 100 by a sputtering method, whereby a first conductive layer 107 was formed. In order to have a microcavity effect, the thickness of the first conductive layer 107 was set to 75 nm, 40 nm, and 10 nm in the example element 1-R, the example element 1-G, and the example element 1-B, respectively.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. in a heating chamber of the vacuum evaporation apparatus for 30 minutes, and then the substrate was cooled down for about 30 minutes.

Then, the substrate over which the anode 100 was formed was fixed to a substrate holder provided in the vacuum evaporation apparatus so that the surface over which the anode 100 was formed faced downward. The pressure in the vacuum evaporation apparatus was reduced to about $10^{-4}$ Pa. After that, on the anode 100, 3-[4-(9-phenanthryl)-phenyl]-9-phenyl-9H-carbazole (abbreviation: PCPPn) represented by the above structural formula (i) and molybdenum(VI) oxide were deposited by co-evaporation by an evaporation method using resistance heating, whereby a first hole-injection layer 111_1 was formed. The thickness of the first hole-injection layer 111_1 was 8.5 nm, 13.5 nm, and 5 nm in the example element 1-R, the example element 1-G, and the example element 1-B, respectively. The weight ratio of PCPPn to molybdenum oxide was adjusted to 1:0.5 (=PCPPn:molybdenum oxide). Note that a co-evaporation method refers to an evaporation method in which evaporation is carried out from a plurality of evaporation sources at the same time in one treatment chamber.

Next, on the first hole-injection layer 111_1, PCPPn was deposited to a thickness of 10 nm, whereby a first hole-transport layer 112_1 was formed.

Further, on the first hole-transport layer 112_1, 9-[4-(10-phenyl-9-anthryl)phenyl]-9H-carbazole (abbreviation: CzPA) represented by the above structural formula (ii) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the above structural formula (iii) were deposited by co-evaporation to a thickness of 25 nm so that the weight ratio of CzPA to 1,6mMemFL-PAPrn was 1:0.05 (=CzPA: 1,6mMemFLPAPm), whereby a first light-emitting layer 113_1 was formed.

After that, CzPA was deposited to a thickness of 5 nm, and 2,9-bis(naphthalen-2-yl)-4,7-diphenyl-1,10-phenanthroline (abbreviation: NBPhen) represented by the above structural formula (iv) was deposited to a thickness of 15 nm, whereby a first electron-transport layer 114_1 was formed. Components from the first hole-injection layer 111_1 to the first electron-transport layer 114_1 are collectively referred to as a first light-emitting unit 102_1.

A charge generation layer 103 was formed on the first light-emitting unit 102_1. The charge generation layer 103 was formed in the following manner. First, as part of an electron-injection buffer region 105, a lithium layer was formed by using lithium oxide. The thickness thereof was 0.1 nm. Then, as an electron-relay region, copper phthalocyanine (abbreviation: CuPC) represented by the above structural formula (v) was deposited to a thickness of 2 nm. After that, as a charge generation region 104, 4,4',4"-(benzene-1,3,5-triyl)tri(dibenzothiophene) (abbreviation: DBT3P-II) represented by the above structural formula (vi) and molybdenum(VI) oxide were deposited by co-evaporation to a thickness of 12.5 nm. Note that the weight ratio of DBT3P-II to molybdenum oxide was adjusted to 1:0.5 (=DBT3P-II:molybdenum oxide).

Next, on the charge generation layer 103, 4-phenyl-4'-(9-phenylfluoren-9-yl)triphenylamine (abbreviation: BPAFLP) represented by the above structural formula (vii) was deposited to a thickness of 20 nm as a second hole-transport layer 112_2.

Then, 2-[3'-(dibenzothiophen-4-yl)biphenyl-3-yl]dibenzo[f,h]quinoxaline (abbreviation: 2mDBTBPDBq-II) represented by the above structural formula (viii), 4,4'-di(1-naphthyl)-4"-(9-phenyl-9H-carbazol-3-yl)triphenylamine (abbreviation: PCBNBB) represented by the above structural formula (ix), and bis[2-(6-tert-butyl-4-pyrimidinyl-κN3)phenyl-κC](2,4-pentanedionato-κ²O,O')iridium(III) (abbreviation: Ir(tBuppm)$_2$(acac)) represented by the above structural formula (x) were deposited by co-evaporation to a thickness of 20 nm so that the weight ratio of 2mDBTBP-DBq-II to PCBNBB and Ir(tBuppm)$_2$(acac) was 0.7:0.3:0.06 (=2mDBTBPDBq-II:PCBNBB:Ir(tBuppm)$_2$(acac)). After that, 2mDBTBPDBq-II and bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: Ir(dmdppr-P)$_2$(dibm)) represented by the above structural formula (xi) were deposited by co-evaporation to a thickness of 20 nm so that the weight ratio of 2mDBTBPDBq-II to Ir(dmdppr-P)$_2$(dibm) was 1:0.04 (=2mDBTBPDBq-II:Ir(dmdppr-P)$_2$(dibm)), whereby a second light-emitting layer 113_2 was formed.

After that, on the second light-emitting layer 113_2, 2mDBTBPDBq-II was deposited to a thickness of 30 nm, and NBPhen was deposited to a thickness of 15 nm, whereby a second electron-transport layer 114_2 was formed.

After the second electron-transport layer 114_2 was formed, lithium fluoride (LiF) was deposited by evaporation to a thickness of 1 nm, whereby an electron-injection layer 115_2 was formed. Finally, as a cathode 101, a silver-magnesium alloy was deposited to a thickness of 15 nm and indium tin oxide (ITO) was deposited to a thickness of 70 nm. Accordingly, the light-emitting element of this example (the example elements 1-R, 1-G, and 1-B) was fabricated. Components from the second hole-transport layer 112_2 to the electron-injection layer 115_2 correspond to a second light-emitting unit 102_2.

Note that in all the above evaporation steps, evaporation was performed by a resistance-heating method.

Now, a method for fabricating the comparative light-emitting element of this example (the comparative example elements 1-R, 1-G, and 1-B) will be described.

(Method for Fabricating the Comparative Example Elements 1-R, 1-G, and 1-B)

The comparative example element 1-R was obtained by setting the thickness of the first hole-injection layer 111_1 in the example elements 1-R, 1-G, and 1-B to 13.5 nm. The comparative example element 1-G was obtained by setting the thickness of the first hole-injection layer 111_1 in the example elements 1-R, 1-G, and 1-B to 16 nm. The comparative example element 1-B was obtained by setting the thickness of the first hole-injection layer 111_1 in the example elements 1-R, 1-G, and 1-B to 7.5 nm. Furthermore, the first electron-transport layer 114_1 and the second electron-transport layer 114_2 were formed by using bathophenanthroline (abbreviation: BPhen) represented by the above structural formula (xii) instead of NBPhen. Other components were formed in a manner similar to those of the example elements 1-R, 1-G, and 1-B.

The example elements 1-R, 1-G, and 1-B and the comparative example elements 1-R, 1-G, and 1-B were each sealed by using a glass substrate provided with a color filter in a glove box containing a nitrogen atmosphere so as not to be exposed to the air (specifically, a sealant was applied onto an outer edge of the element and UV treatment and heat treatment at 80° C. for 1 hour were performed at the time of sealing). Then, characteristics of these light-emitting elements were measured. Note that the measurements were performed at room temperature (in an atmosphere kept at 25° C.).

Next, a method for measuring the characteristics of the example elements 1-R, 1-G, and 1-B and the comparative example elements 1-R, 1-G, and 1-B will be described.

The fabricated red elements (the example element 1-R and the comparative example element 1-R) were provided with a color filter layer CF(R), the fabricated green elements (the example element 1-G and the comparative example element 1-G) were provided with a color filter layer CF(G), and the fabricated blue elements (the example element 1-B and the comparative example element 1-B) were provided with a color filter layer CF(B). In this state, the element characteristics were measured.

The color filter layer CF(R), the color filter layer CF(G), and the color filter layer CF(B) were formed in such a manner that CR-7001W, CG-7001W, and CB-7001 W (each manufactured by FUJIFILM Corporation) which were each used as a material were applied onto a glass substrate, and then baked at 220° C. for 1 hour. The thickness of the color filter layer was 1.3 μm to 1.4 μm. Note that the color filter materials were applied onto the glass substrate by a spin coating method at a spinning rate of 500 rpm for the color filter layer CF(R), at a spinning rate of 1000 rpm for the color filter layer CF(G), and at a spinning rate of 2000 rpm for the color filter layer CF(B).

Figure 8:
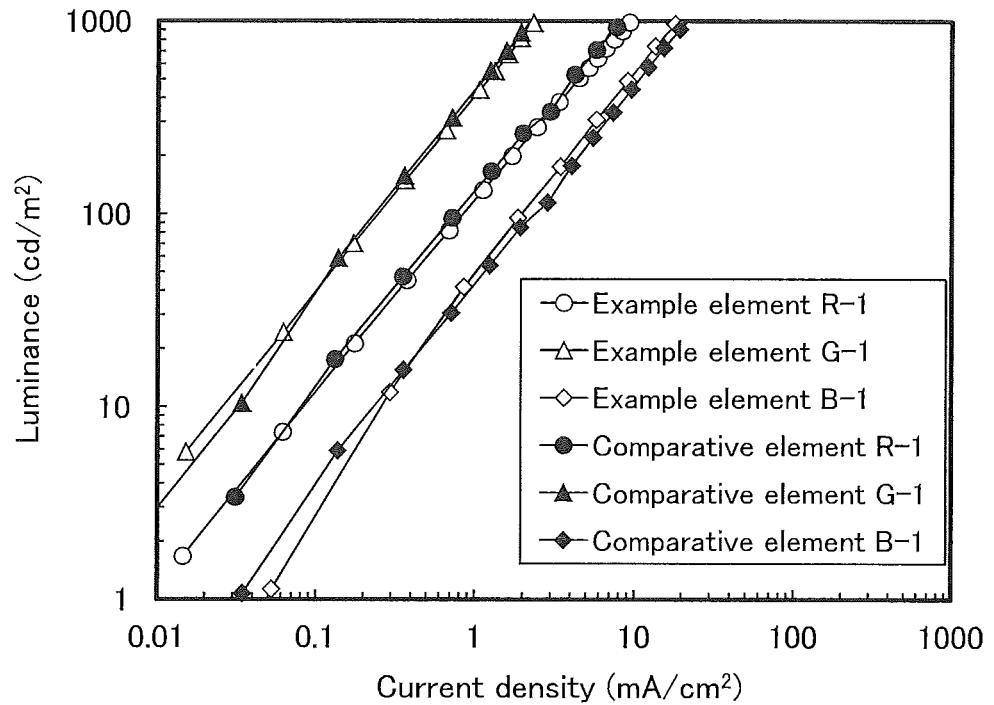
FIG. 8 shows current density-luminance characteristics of an example element 1 and a comparative example element 1.
Figure 9:
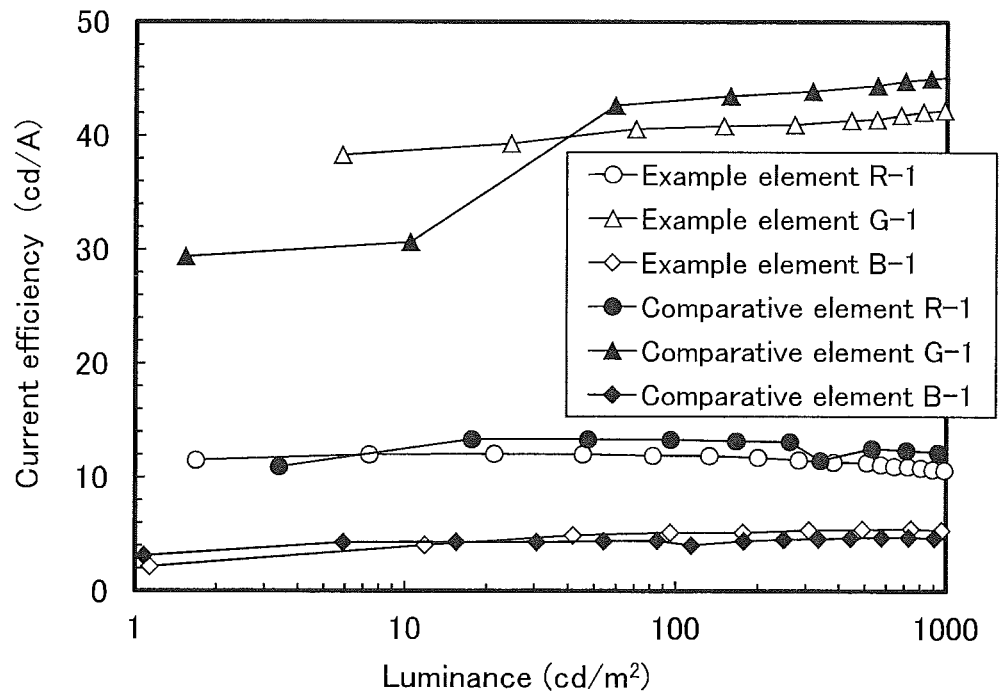
FIG. 9 shows luminance-current efficiency characteristics of the example element 1 and the comparative example element 1.
Figure 10:
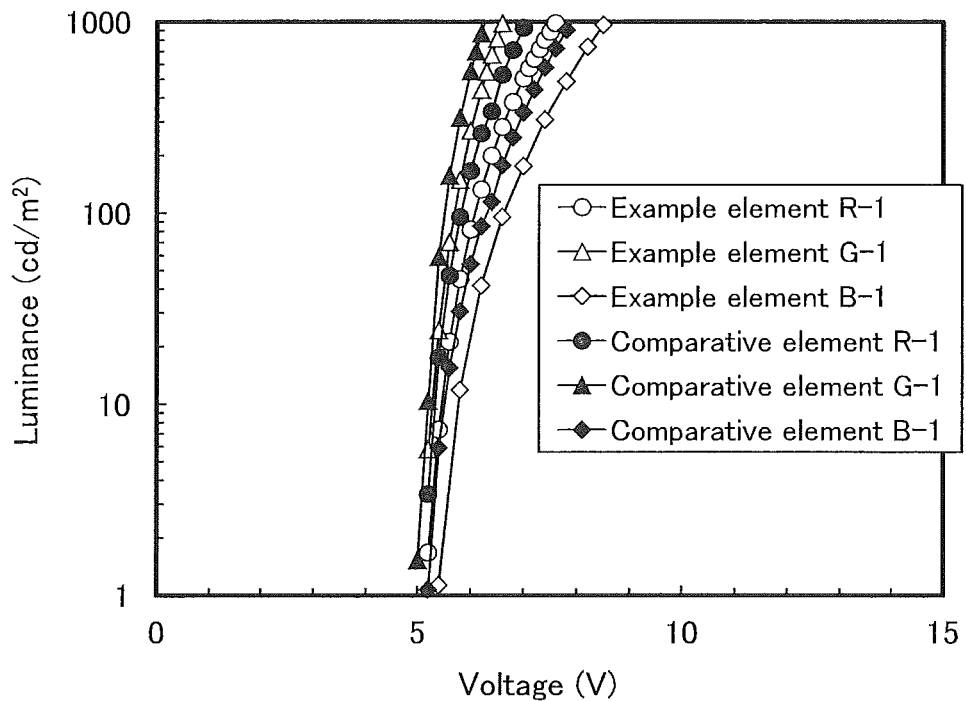
FIG. 10 shows voltage-luminance characteristics of the example element 1 and the comparative example element 1.
Figure 11:
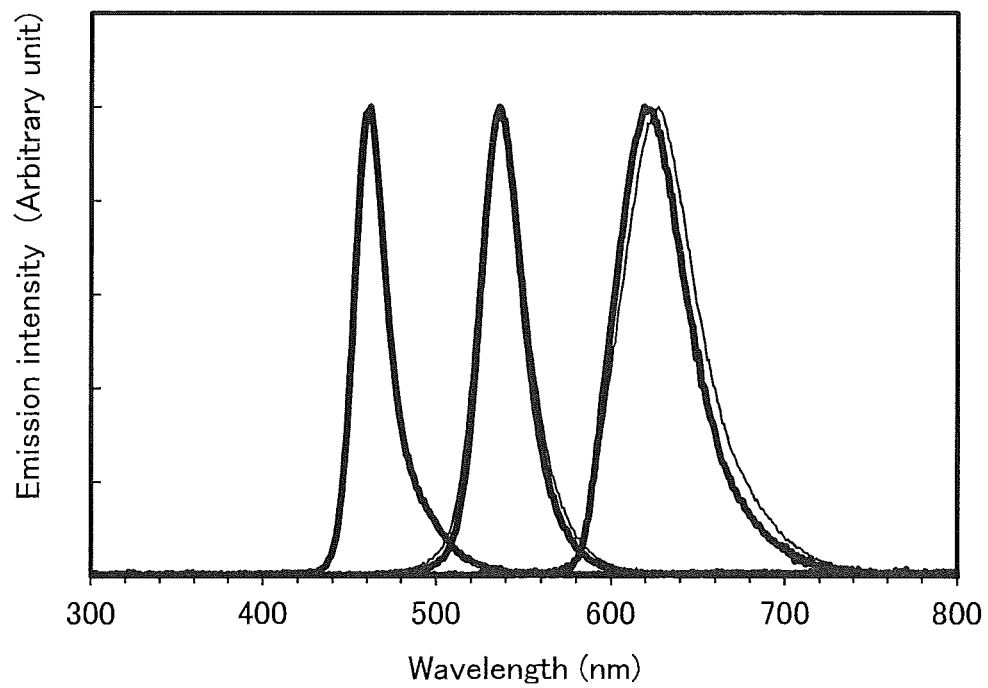
FIG. 11 shows emission spectra of the example element 1 and the comparative example element 1.

FIG. 8 shows the current density-luminance characteristics of the example elements 1-R, 1-G, and 1-B and the comparative example elements 1-R, 1-G, and 1-B, FIG. 9 show the luminance-current efficiency characteristics thereof, FIG. 10 shows the voltage-luminance characteristics thereof, and FIG. 11 shows the emission spectra.

As seen from the above, it was found that there are no large differences between the initial characteristics of the example elements 1-R, 1-G, and 1-B and the comparative example elements 1-R, 1-G, and 1-B.

Figure 14:
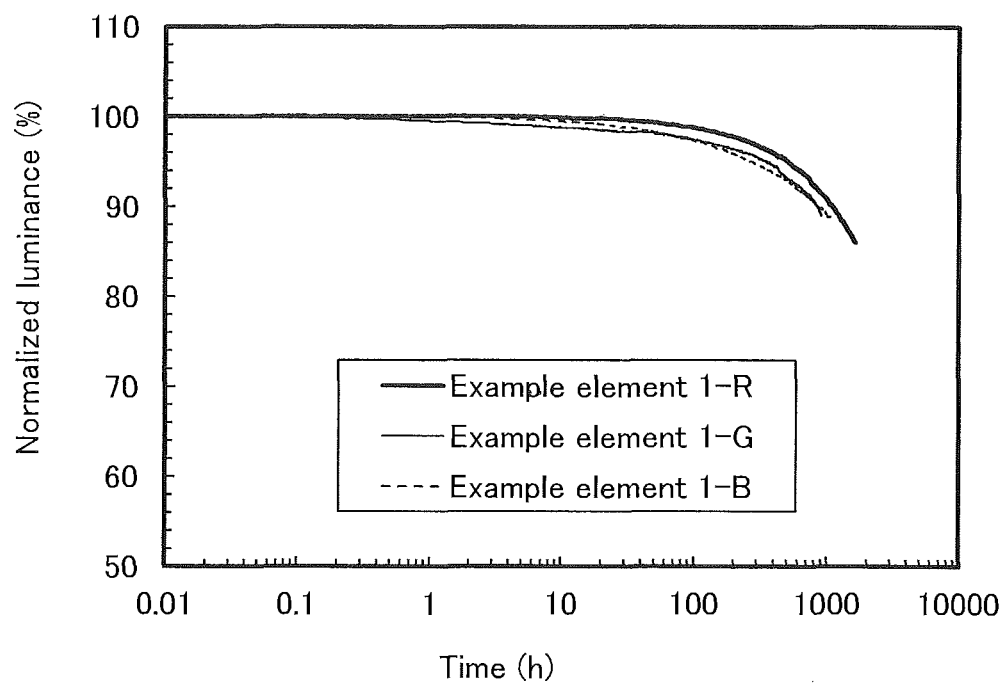
FIG. 14 shows time dependence characteristics of normalized luminance of the example element 1.

Next, the reliability of the example elements 1-R, 1-G, and 1-B was examined. FIG. 14 is a graph showing the change in luminance with respect to the driving time under the condition that the initial luminance of the example element 1-R was 655 cd/m$^2$, the initial luminance of the example element 1-G was 1667 cd/m$^2$, the initial luminance of the example element 1-B was 249 cd/m$^2$, and each initial luminance was set to 100% with the current efficiency constant. The initial luminance of each element was a value of the luminance ratio of a white light-emitting element that has chromaticity of D65 and is fabricated by using these elements.

From FIG. 14, it was found that the example elements 1-R, 1-G, and 1-B each have a high reliability.

Then, a method for fabricating elements (an example element 2 and a comparative example element 2) to evaluate crosstalk is described.

(Method for Fabricating Example Element 2)

To evaluate crosstalk, a passive matrix panel whose resolution was 326 ppi was fabricated. In this panel, pixels for R, G, and B were arranged in a stripe. The pixel size was 78 μm×78 μm. The size of a subpixel (in each pixel for R, G, or B) was 26 μm×78 μm. The aperture ratio was 65.7%.

Substances used in the example element 2 and the comparative example element 2 are shown below. For the materials also used in the example element 1 and the comparative example element 1, the above structural formulae are referred to.

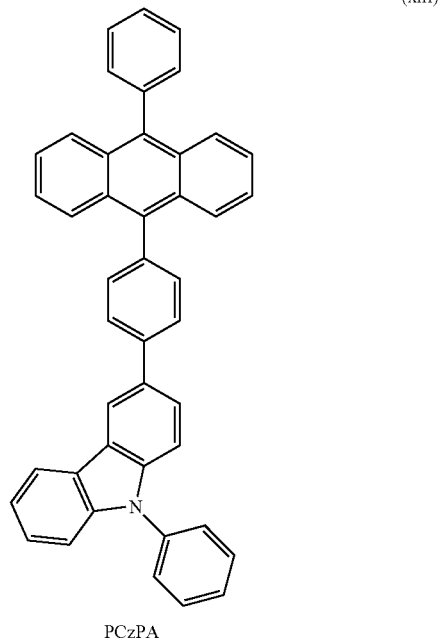

(xiii)

PCzPA

-continued

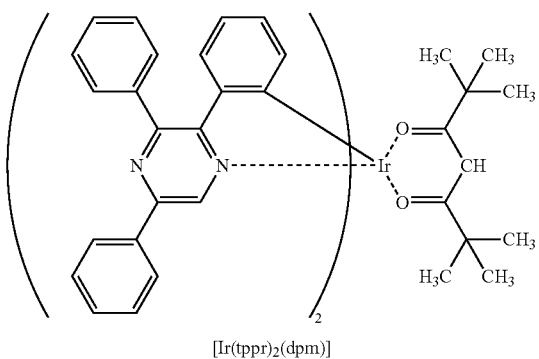

(xiv)

[Ir(tppr)₂(dpm)]

In each pixel, as an anode 100, an aluminum-nickel-lanthanum alloy film and a titanium film were sequentially deposited by a sputtering method. The thickness of the aluminum-nickel-lanthanum alloy film was 200 nm and the thickness of the titanium film was 6 nm.

Then, indium tin oxide containing silicon oxide (ITSO) was deposited over the anode 100 by a sputtering method, whereby a first conductive layer 107 was formed. In order to have a microcavity effect in the pixel for R, the pixel for G, and the pixel for B of the example element 2, the thickness of the first conductive layer 107 was set to 80 nm in the pixel for R, the thickness of the first conductive layer 107 was set to 40 nm in the pixel for G, and the first conductive layer 107 was not provided in the pixel for B.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. in a heating chamber of the vacuum evaporation apparatus for 30 minutes, and then the substrate was cooled down for about 30 minutes.

Then, the substrate over which the anode 100 was formed was fixed to a substrate holder provided in the vacuum evaporation apparatus so that the surface over which the anode 100 was formed faced downward. The pressure in the vacuum evaporation apparatus was reduced to about $10^{-4}$ Pa. After that, on the anode 100, 9-phenyl-3-[4-(10-phenyl-9-anthryl)phenyl]-9H-carbazole (abbreviation: PCzPA) represented by the above structural formula (xiii) and molybdenum(VI) oxide were deposited by co-evaporation by an evaporation method using resistance heating, whereby a first hole-injection layer 111_1 was formed. The thickness was set to 13 nm. The weight ratio of PCzPA to molybdenum oxide was adjusted to 1:0.5 (=PCzPA:molybdenum oxide). Note that the co-evaporation method refers to an evaporation method in which evaporation is carried out from a plurality of evaporation sources at the same time in one treatment chamber.

Next, PCzPA was deposited to a thickness of 20 nm on the first hole-injection layer 111_1, whereby a first hole-transport layer 112_1 was formed.

Then, on the first hole-transport layer 112_1, 9-[4-(10-phenyl-9-anthryl)phenyl]-9H-carbazole (abbreviation: CzPA) represented by the above structural formula (ii) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) represented by the above structural formula (iii) were deposited by co-evaporation to a thickness of 30 nm so that the weight ratio of CzPA to 1,6mMemFL-PAPrn was 1:0.05 (=CzPA:1,6mMemFLPAPrn), whereby a first light-emitting layer 113_1 was formed.

After that, CzPA was deposited to a thickness of 5 nm, and 2,9-bis(naphthalen-2-yl)-4,7-diphenyl-1,10-phenanthroline (abbreviation: NBPhen) represented by the above structural formula (iv) was deposited to a thickness of 15 nm, whereby a first electron-transport layer 114_1 was formed. Components from the first hole-injection layer 111_1 to the first electron-transport layer 114_1 are collectively referred to as a first light-emitting unit 102_1.

A charge generation layer 103 was formed on the first light-emitting unit 102_1. The charge generation layer 103 was formed in the following manner. First, as part of an electron-injection buffer region 105, a lithium layer was formed by using lithium oxide. The thickness thereof was 0.1 nm. Then, as an electron-relay region, copper phthalocyanine (abbreviation: CuPC) represented by the above structural formula (v) was deposited to a thickness of 2 nm. After that, as a charge generation region 104, PCzPA and molybdenum(VI) oxide were deposited by co-evaporation to a thickness of 13 nm. The weight ratio of PCzPA to molybdenum oxide was adjusted to 1:0.5 (=DBT3P-II: molybdenum oxide).

Next, on the charge generation layer 103, 4-phenyl-4'-(9-phenylfluoren-9-yl)triphenylamine (abbreviation: BPAFLP) represented by the above structural formula (vii) was deposited to a thickness of 20 nm as a second hole-transport layer 112_2.

Then, 2-[3'-(dibenzothiophen-4-yl)biphenyl-3-yl]dibenzo[f,h]quinoxaline (abbreviation: 2mDBTBPDBq-II) represented by the above structural formula (viii), 4,4'-di(1-naphthyl)-4''-(9-phenyl-9H-carbazol-3-yl)triphenylamine (abbreviation: PCBNBB) represented by the above structural formula (ix), and bis[2-(6-tert-butyl-4-pyrimidinyl-κN3)phenyl-κC](2,4-pentanedionato-κ²O,O')iridium(III) (abbreviation: Ir(tBuppm)₂(acac)) represented by the above structural formula (x) were deposited by co-evaporation to a thickness of 20 nm so that the weight ratio of 2mDBTBP-DBq-II to PCBNBB and Ir(tBuppm)₂(acac) was 0.7:0.3:0.06 (=2mDBTBPDBq-II:PCBNBB:Ir(tBuppm)₂(acac)). Then, 2mDBTBPDBq-II and bis(2,3,5-triphenylpyrazinato) (dipivaloylmethanato)iridium(III) (abbreviation: Ir(tppr)₂(dpm)) represented by the structural formula (xiv) were deposited by co-evaporation to a thickness of 20 nm so that the weight ratio of 2mDBTBPDBq-II to Ir(tppr)₂(dpm) was 1:0.06 (=2mDBTBPDBq-II:Ir(tppr)₂(dpm)), whereby a second light-emitting layer 113_2 was formed.

After that, on the second light-emitting layer 113_2, 2mDBTBPDBq-II was deposited to a thickness of 15 nm, and bathophenanthroline (abbreviation: BPhen) represented by the structural formula (xii) was deposited to a thickness of 15 nm, whereby a second electron-transport layer 114_2 was formed.

After the second electron-transport layer 114_2 was formed, lithium fluoride (LiF) was deposited by evaporation to a thickness of 1 nm, whereby an electron-injection layer 115_2 was formed. Lastly, silver was deposited to a thickness of 15 nm and then PCzPA was deposited to a thickness of 70 nm to form the cathode 101. Thus, the example element 2 was fabricated. Components from the second hole-transport layer 112_2 to the electron-injection layer 115_2 corresponds to a second light-emitting unit 102_2.

Note that in the above evaporation steps, evaporation was performed by a resistance-heating method.

Now, a method for fabricating the comparative light-emitting element (the comparative example element 2) will be described.

(Method for Fabricating the Comparative Example Element 2)

The comparative example element 2 was fabricated by using bathophenanthroline (abbreviation: BPhen) represented by the above structural formula (xii) for the first electron-transport layer 114_1 instead of NBPhen that was used in the example element 2. Other components were formed in a manner similar to those of the example element 2.

The example element 2 and the comparative example element 2 were each sealed using a glass substrate provided with a color filter in a glove box containing a nitrogen atmosphere so as not to be exposed to the air (specifically, a sealant was applied onto an outer edge of the element and UV treatment and heat treatment at 80° C. for 1 hour were performed at the time of sealing). Then, characteristics of these light-emitting elements were measured. Note that the measurements were performed at room temperature (in an atmosphere kept at 25° C.).

Figure 12:
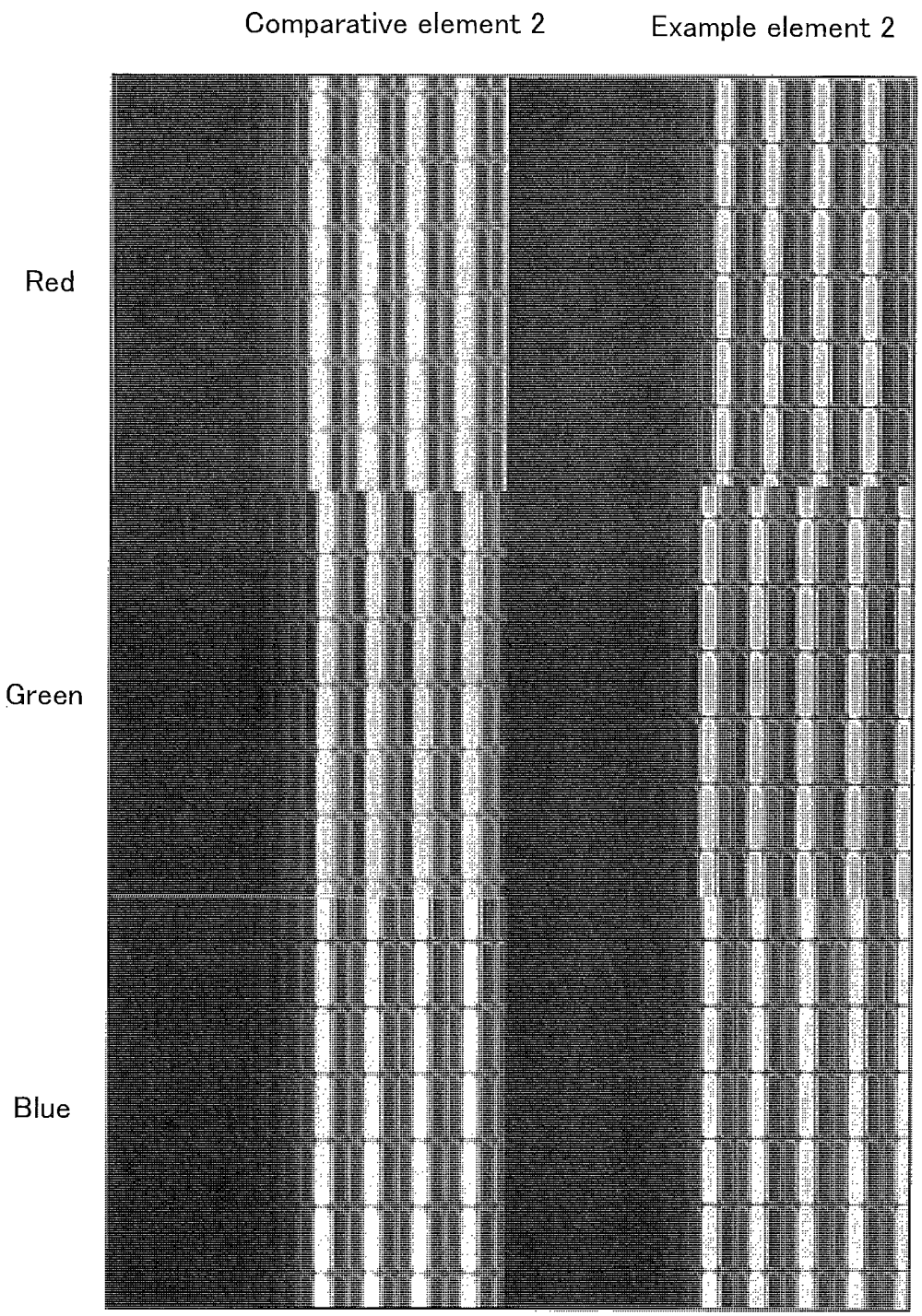
FIG. 12 shows enlarged photographs of display devices in which an example element 2 and a comparative element 2 are used.

FIG. 12 shows the results of examining crosstalk. In FIG. 12, enlarged photographs of display devices that were formed by using the comparative example element 2 and the example element 2 are shown. A photograph in which only red pixels emit light, a photograph in which only green pixels emit light, and a photograph in which only blue pixels emit light are shown from the top to the bottom.

It was found that in the display device fabricated using the comparative example element 2, pixels adjacent to the pixels which emit light also somewhat emit light. On the other hand, in the display device fabricated using the example element 2, light emission of pixels adjacent to the pixels which emit light is weak. In addition, in the display device using the example element 2, there are a small number of lines of pixels which can be recognized on the left side of the leftmost pixels that emit light.

As described above, in the light-emitting element according to one embodiment of the present invention, crosstalk between pixels can be effectively suppressed. In particular, in a high-definition display device in which the distance between pixels is less than or equal to 80 μm and the distance between subpixels is less than or equal to 30 μm, the light-emitting element according to one embodiment of the present invention is effective to suppress crosstalk between pixels.

This application is based on Japanese Patent Application serial no. 2013-166867 filed with Japan Patent Office on Aug. 9, 2013, the entire contents of which are hereby incorporated by reference.

What is claimed is:

1. A light-emitting element comprising:
    a first electrode;
    an EL layer over the first electrode; and
    a second electrode over the EL layer,
    wherein the EL layer comprises a first light-emitting layer, a first layer, a first charge generation layer and a second light-emitting layer,
    wherein the first charge generation layer comprises lithium,
    wherein the first layer is provided between the first light-emitting layer and the first charge generation layer, and
    wherein the first layer comprises a compound represented by the following Formula (iv):

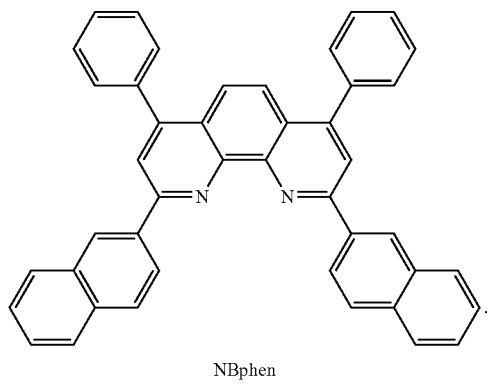

NBphen

2. The light-emitting element according to claim 1, wherein the first charge generation layer comprises at least a charge generation region and an electron-injection buffer region.

3. The light-emitting element according to claim 2, wherein an electron-relay region is provided between the charge generation region and the electron-injection buffer region.

4. The light-emitting element according to claim 2, wherein the electron-injection buffer region comprises lithium.

5. The light-emitting element according to claim 2,
    wherein the charge generation region comprises:
        a layer comprising a substance having a hole-transport property; and
        a layer comprising an acceptor substance.

6. The light-emitting element according to claim 1,
    wherein the EL layer further comprises a second layer, a second charge generation layer and a third light-emitting layer, and
    wherein the second charge generation layer comprises lithium,
    wherein the second layer is provided between the second light-emitting layer and the second charge generation layer, and
    wherein the second layer comprises the compound represented by the Formula (iv).

7. The light-emitting element according to claim 1, wherein the EL layer further comprises a hole-injection layer, a hole-transport layer and an electron-transport layer comprising the first layer.

8. The light-emitting element according to claim 1,
    wherein the EL layer further comprises a layer containing a condensed heteroaromatic compound,
    wherein the layer containing a condensed heteroaromatic compound comprises iridium and a compound which comprises two nitrogen atoms in one condensed ring, and
    wherein the layer containing a condensed heteroaromatic compound is in contact with the first layer.

9. The light-emitting element according to claim 8, wherein the iridium is contained in part of the layer containing a condensed heteroaromatic compound and not contained in a region in contact with the first layer.

10. A light-emitting device comprising:
    the light-emitting element according claim 1; and
    a unit configured to control the light-emitting element.

11. A display device comprising:
the light-emitting device according to claim 10; and
a unit configured to control the light-emitting device.

12. A lighting device comprising:
the light-emitting element according to claim 1 in a lighting portion; and
a unit configured to control the light-emitting element.

13. A light-emitting element comprising:
a first electrode;
an EL layer over the first electrode, the EL layer comprising:
  a first light-emitting layer over the first electrode;
  a first layer over the first light-emitting layer;
  a first charge generation layer over and in contact with the first layer; and
  a second light-emitting layer over the first charge generation layer; and
a second electrode over the EL layer,
wherein the first charge generation layer comprises lithium, and
wherein the first layer comprises a compound represented by the following Formula (iv):

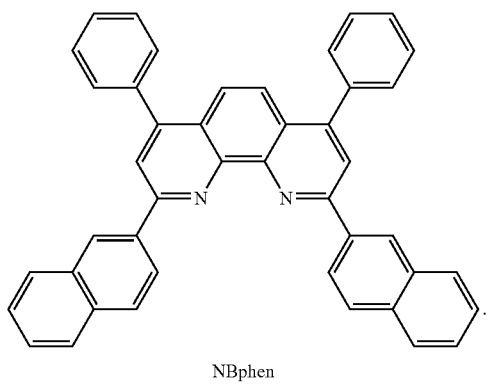

NBphen (iv)

14. The light-emitting element according to claim 13, wherein the first charge generation layer comprises at least a charge generation region and an electron-injection buffer region.

15. The light-emitting element according to claim 14, wherein an electron-relay region is provided between the charge generation region and the electron-injection buffer region.

16. The light-emitting element according to claim 14, wherein the electron-injection buffer region comprises lithium.

17. The light-emitting element according to claim 14, wherein the charge generation region comprises:
  a layer comprising a substance having a hole-transport property; and
  a layer comprising an acceptor substance.

18. The light-emitting element according to claim 13, wherein the EL layer further comprises:
  a second layer over the second light-emitting layer;
  a second charge generation layer over the second layer; and
  a third light-emitting layer over the second charge generation layer, and
wherein the second charge generation layer comprises lithium, and
wherein the second layer comprises the compound represented by the Formula (iv).

19. The light-emitting element according to claim 13, wherein the EL layer further comprises:
  a hole-injection layer over the first electrode; and
  a hole-transport layer between the hole-injection layer and the first light-emitting layer.

20. The light-emitting element according to claim 13, wherein the EL layer further comprises a layer containing a condensed heteroaromatic compound,
wherein the layer containing a condensed heteroaromatic compound comprises iridium and a compound which comprises two nitrogen atoms in one condensed ring, and
wherein the layer containing a condensed heteroaromatic compound is in contact with the first layer.

21. The light-emitting element according to claim 14, wherein the iridium is contained in part of the layer containing a condensed heteroaromatic compound and not contained in a region in contact with the first layer.

22. A light-emitting device comprising:
the light-emitting element according claim 13; and
a unit configured to control the light-emitting element.

23. A display device comprising:
the light-emitting device according to claim 22; and
a unit configured to control the light-emitting device.

24. A lighting device comprising:
the light-emitting element according to claim 13 in a lighting portion; and
a unit configured to control the light-emitting element.

* * * * *